(12) United States Patent
Tanobe et al.

(10) Patent No.: US 8,333,517 B2
(45) Date of Patent: Dec. 18, 2012

(54) SEMICONDUCTOR SUBMODULE, METHOD FOR CONNECTING CONNECTOR AND SEMICONDUCTOR SUBMODULE, AND OPTICAL MODULE

(75) Inventors: Hiromasa Tanobe, Atsugi (JP); Yoshihisa Sakai, Atsugi (JP); Masaru Kobayashi, Atsugi (JP); Ryo Nagase, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 620 days.

(21) Appl. No.: 12/525,797

(22) PCT Filed: Feb. 4, 2008

(86) PCT No.: PCT/JP2008/051791
§ 371 (c)(1),
(2), (4) Date: Sep. 1, 2009

(87) PCT Pub. No.: WO2008/096716
PCT Pub. Date: Aug. 14, 2008

(65) Prior Publication Data
US 2010/0074581 A1  Mar. 25, 2010

(30) Foreign Application Priority Data
Feb. 5, 2007 (JP) .................... 2007-025986

(51) Int. Cl.
*G02B 6/10* (2006.01)
*G02B 6/30* (2006.01)
(52) U.S. Cl. .............................. 385/92; 385/129; 385/49
(58) Field of Classification Search .................... None
See application file for complete search history.

(56) References Cited

U.S. PATENT DOCUMENTS

| 5,249,245 A * | 9/1993 | Lebby et al. ..................... 385/89 |
| 5,694,506 A | 12/1997 | Kobayashi et al. |
| 5,742,480 A | 4/1998 | Sawada et al. |
| 2003/0138223 A1 | 7/2003 | Sasaki et al. |

FOREIGN PATENT DOCUMENTS

| JP | 2-118607 | 5/1990 |
| JP | 6-151903 | 5/1994 |
| JP | 8-136767 | 5/1996 |
| JP | 9-159860 | 6/1997 |
| JP | 2000-304966 | 2/2000 |

(Continued)

OTHER PUBLICATIONS

Snap 12, Appendix to SNAP12 Multi-Source Agreement, Rev. 1.1, May 15, 2002.
Yuzo Ishii et al., *SMT-Compatible Large-Tolerance "OptoBump" Interface for Interchip Optical Interconnections*, IEEE Transactions on Advanced Packaging, vol. 26, No. 2, May 2003, pp. 122-127.

(Continued)

*Primary Examiner* — Charlie Peng
*Assistant Examiner* — Mary El Shammaa
(74) *Attorney, Agent, or Firm* — Worman Nydegger

(57) ABSTRACT

A semiconductor submodule includes a substrate (10) as a first substrate having at least one hole, and at least one optical semiconductor device (16) disposed such that light travels through the hole, a substrate (11) as a second substrate having a semiconductor device (26) for driving the optical semiconductor device (16) and amplifying signals and an electrical connector (28) for inputting and outputting electrical signals from and to the outside, and a flexible cable (12) electrically connecting an end of the substrate (10) and an end of the substrate (11) and allowing the first substrate to be folded opposite to the surface on which the optical semiconductor device is mounted.

10 Claims, 28 Drawing Sheets

FOREIGN PATENT DOCUMENTS

| | | |
|---|---|---|
| JP | 3150070 | 3/2001 |
| JP | 2002-189137 | 7/2002 |
| JP | 3511479 | 3/2004 |
| JP | 3532456 | 5/2004 |
| WO | 2005/057262 | 6/2005 |
| WO | WO 2005/121855 A1 | 12/2005 |

OTHER PUBLICATIONS

Office Action issued on Jul. 12, 2012 in corresponding Japanese Patent Application No. 2008-557106.

* cited by examiner

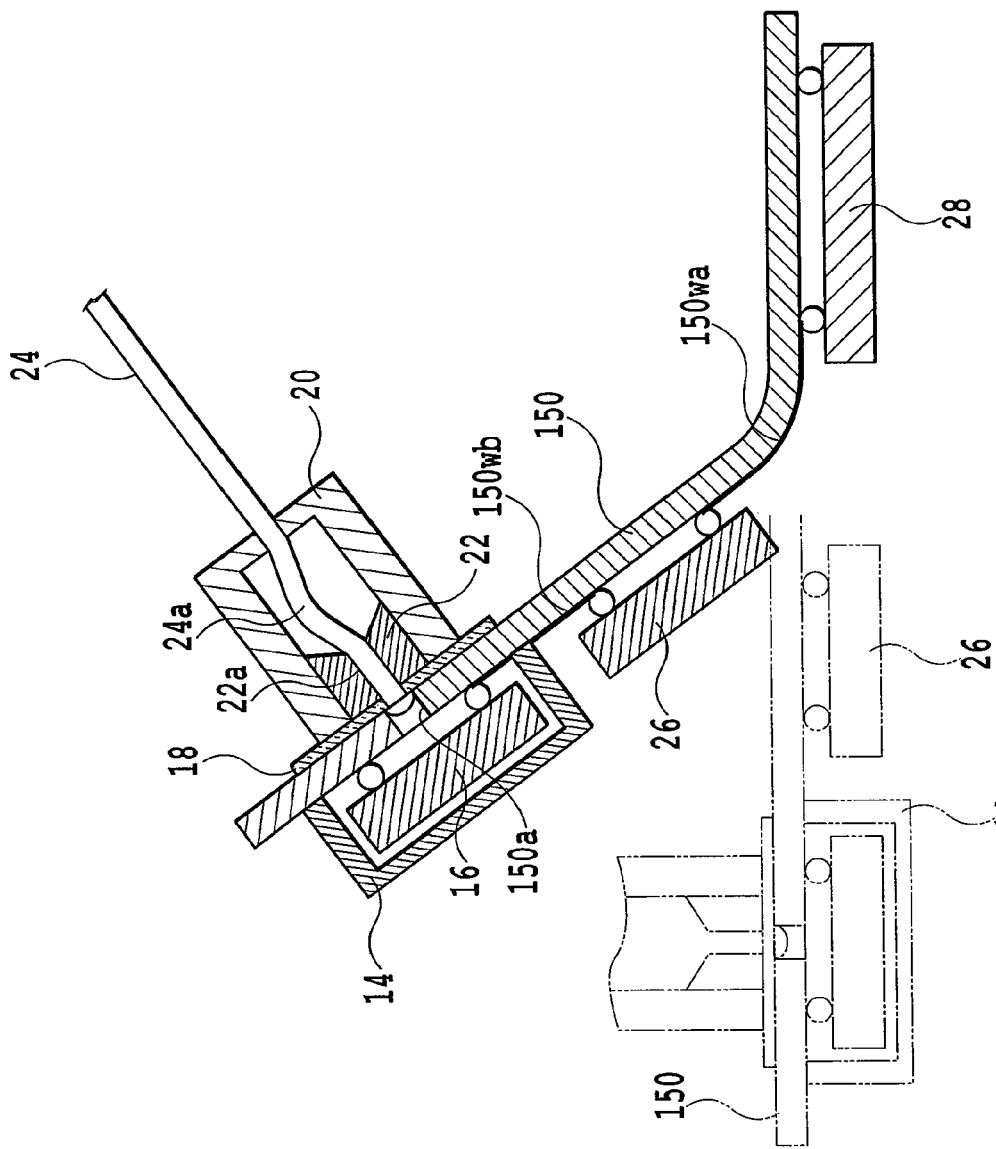

SEMICONDUCTOR SUBMODULE, METHOD FOR CONNECTING CONNECTOR AND SEMICONDUCTOR SUBMODULE, AND OPTICAL MODULE

CROSS-REFERENCE TO RELATED APPLICATIONS

Not applicable.

TECHNICAL FIELD

The present invention relates to a semiconductor submodule, a method for connecting a connector and the semiconductor submodule, and an optical module wherein the size of the body of the optical module can be reduced when connecting an optical connector as a result of a relative movement of one substrate having an optical semiconductor device or semiconductor device provided thereon among a plurality of substrates connected to each other.

BACKGROUND ART

When an optical semiconductor device constituting an optical interface is flip-chip mounted on a surface of a substrate which a module having the optical interface and electronic components are combined, optical input and optical output is provided in a direction perpendicular to the surface of the substrate at the input/output ends of the optical semiconductor device which may be a surface emitting device, such as, typically, a surface emission laser or photo-detector, or which may be a surface photoreceptor. An optical fiber for guiding an optical signal is required to be laid such that the axis thereof will be in parallel with the surface of the substrate because of requirements including apparatus specifications. A mismatch therefore arises between the direction of optical input and output at the input/output ends of the optical semiconductor device and the installation direction required of the optical fiber.

As a first method in resolving such a situation, for example, a method proposes as disclosed in Patent Document 1, that a light-receiving section and a light-emitting section of an optical semiconductor device constituting an optical interface disposed on a substrate are connected with connecting ends of the optical fibers through connectors constituted by a receptacle and a plug, for example.

According to such a method, as shown in FIG. 23, optical signals are input and output at a light-receiving section 2R and a light-emitting section 2P of an optical semiconductor device 2 disposed on a substrate 1, respectively, along a direction that is perpendicular to a surface of the substrate 1 as indicated by the arrows. Connecting ends of an optical fiber 3 connected to the light-receiving section 2R and an optical fiber 4 connected to the light-emitting section 2P, respectively, are connected with the fibers at parts thereof located upstream or downstream of the connecting ends being bent at about 90 degrees such that the connecting ends become perpendicular to the surface of the substrate.

As a second method, a method is proposed as disclosed in Patent Documents 2 and 3, in which end faces of optical fibers facing a light-receiving section and a light-emitting section of an optical semiconductor device, respectively, are processed to provide them with a 45 degrees reflector (reflection surface). In this case, as shown in FIG. 24, optical fibers 5 and 6 are disposed such that their axes are in parallel with a surface of a substrate 1 on which an optical semiconductor device 2 as described above is disposed. 45 degrees reflectors 5a and 6a are provided on end faces of the optical fibers 5 and 6 which are opposite to light-receiving section 2R and light-emitting section 2P of the optical semiconductor device 2, respectively. As a result, a light beam guided by the optical fiber 5 along the direction indicated by the arrow is refracted by the 45 degrees reflector 5a at 90 degrees to be input to the light-receiving section 2R.

As a third method, a system as disclosed in Non-Patent Document 1 has been standardized as a de facto standard, according to which an optical semiconductor device is provided on a substrate vertically secured in a position facing a connecting end of an optical fiber such that the substrate intersects the axis of the optical fiber to allow the optical fiber to be laid on a horizontal surface of the substrate.

Patent Document 1: Japanese Patent No. 3,511,479
Patent Document 2: Japanese Patent No. 3,532,456
Patent Document 3: Japanese Patent No. 3,150,070
Non-Patent Document 1: "Appendix to SNAP12 Multi-Source Agreement: Rev. 1.1, May 15, 2002

DISCLOSURE OF THE INVENTION

According to the above-described first method, when a multiplicity of optical semiconductor devices are arranged side by side and a multiplicity of optical fibers are laid, handling may be difficult because each optical fiber is to be connected by bending a part thereof near a connecting end of the optical fiber only in one direction. Further, there are limitations in laying the multiplicity of optical fibers because some space on the substrate is required to allow each optical fiber to be bent at the part near the connecting end of each optical fiber.

According to the above-described second method, in order to provide optical fibers with a 45 degrees reflector, special processes must be performed on optical fibers and connectors, which hinders efforts toward a reduction in manufacturing cost.

Further, according to the above-described third method, it may become more difficult to improve the high-density mounting of optical modules per one piece of substrate, with increasing the area occupied by protruding parts of connector plugs protruding from ends of a multiplicity of optical modules (protruding mounting area).

In view of the above-described mentioned problem, the present invention aims to provide an inexpensive semiconductor submodule, a method for connecting a connector with the semiconductor submodule, and an optical module. The semiconductor submodule, the method for connecting a connector with the semiconductor submodule, and the optical module can be easily attached and removed to the semiconductor submodule. In addition, an optical fiber can be arranged such that axis of the fiber is in parallel with a surface of a substrate constituting the semiconductor submodule without performing a special process on the optical fiber.

In order to achieve the above-described object, a semiconductor submodule according to the present invention is characterized as follows. The submodule includes a first substrate having at least one hole, at least one optical semiconductor device disposed to allow light to pass through the hole, and at least one high-speed electric signal transmission path electrically connected with the optical semiconductor device and a second substrate having a semiconductor device for driving the optical semiconductor device, at least one high-speed electric signal transmission path electrically connected with the semiconductor device, and an electrical connector connected with said high-speed electric signal transmission path and having the function of inputting or outputting high-speed electric signals with respect to the outside. A terminal end of each high-speed electric signal transmission path is connected such that an end face 1 of the first substrate and an end face 2 of the second substrate are connected and such that the optical semiconductor device and the semiconductor device are disposed on a surface side common to them with their end faces connected with each other in the form of a opposed connection. The first substrate has a mechanism for allowing it to be folded toward the opposite side to the surface thereof on which the optical semiconductor device is mounted, either of end faces of the substrate opposite to each other serving as a fulcrum of the mechanism.

A method for connecting a connector with the semiconductor submodule according to the present invention is characterized as follows. The method for connecting a connector with the semiconductor submodule comprises the steps of: orienting a connecting section of a substrate in a predetermined direction when mounting a connector connected with an optical fiber to the connecting section of the substrate to facilitate the mounting of said connector; and folding a part of a substrate having an optical semiconductor device at an angle of 90 degrees to another part thereof during use to prevent the optical fiber from protruding and to align the optical fiber above the another part in a direction that is horizontal with respect to the another part.

Further, an optical module according to the present invention is characterized as follows. The module includes a first substrate on which the optical semiconductor device is mounted and a second substrate on which a driver for driving the optical semiconductor device is mounted. The first substrate is disposed perpendicularly to the second substrate which is horizontally disposed. A connector for optical input and output provided in association with the optical semiconductor device is disposed above the second substrate.

As will be apparent from the above description, the semiconductor submodule, the method for connecting a connector with the semiconductor submodule, and the optical module according to the present invention are advantageous as follows. A terminal end of each high-speed electric signal transmission path is connected such that the end face 1 of the first substrate and the end face 2 of the second substrate are connected and such that the optical semiconductor device and the semiconductor device are disposed on a surface side common to them with their end faces connected with each other in the form of a opposed connection. Also, the first substrate has a mechanism for allowing it to be folded toward the opposite side to the surface thereof on which the optical semiconductor device is mounted, either of end faces of the substrate opposite to each other serving as a fulcrum of the mechanism. Thus, an optical fiber can be easily attached and removed to the semiconductor submodule. In addition, an optical fiber can be aligned such that its axis is in parallel with a surface of a substrate constituting the semiconductor substrate without performing a special process on the optical fibers.

BRIEF DESCRIPTION OF THE DRAWINGS

FIG. 28 is a sectional view schematically showing a general configuration of a sixth embodiment of the semiconductor submodule according to the present invention.

BEST MODE FOR CARRYING OUT THE INVENTION (A) Semiconductor Submodule

Figure 1:
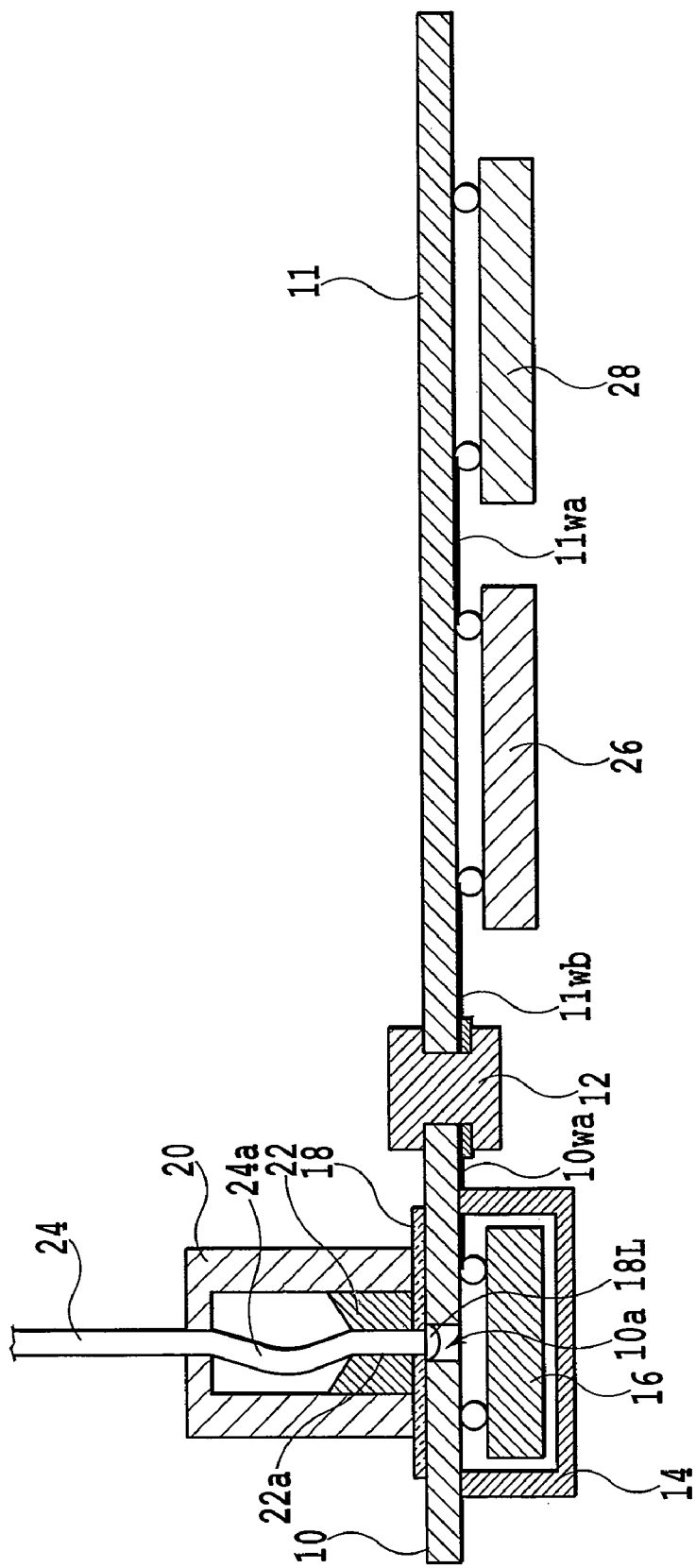
FIG. 1 is a sectional view schematically showing a general configuration of a first embodiment of a semiconductor submodule according to the present invention.

FIG. 1 schematically shows a general configuration of a first embodiment of a semiconductor submodule according to the present invention.

Referring to FIG. 1, the semiconductor submodule includes a substrate 10 as a first substrate having an optical semiconductor device 16 on a part of one surface thereof, a substrate 11 as a second substrate having a semiconductor device 26 for driving the optical semiconductor device 16 and the amplification of signals and an electrical connector 28 for inputting and outputting electrical signals between the semiconductor submodule and the outside, and a flexible cable 12 as flexible connection means for electrically connecting an end of the substrate 10 and an end of the substrate 11.

The substrate 10 is formed from, for example, a polyimide system or acrylic resin, silicon, glass, or liquid crystal polymer in a predetermined thickness. On a surface region of the substrate 10 where the optical semiconductor device 16 is disposed, a high-speed electrical transmission path 10wa is formed, the path being electrically connected to a flexible cable 12 at one end thereof and connected to the optical semiconductor device 16 at another end thereof. For example, high-speed electrical signals are transmitted over the high-speed electrical transmission path 10wa at a communication speed (data transfer amount) not less than 5 Gbps and not more than 100 Gbps.

The periphery of optical semiconductor device 16 is covered and enclosed by a cap 14 provided on the surface. The optical semiconductor device 16 is comprised of any of a surface emission laser, a surface emission laser array, a photo-detector, and a photo-detector array or varying combinations of them. In the first embodiment and other embodiments which will be described later, the optical semiconductor device 16 is illustrated as a typical example which however is not limiting in any sense. It is needless to say that the present invention may be applied to any surface input/output type optical semiconductor device, e.g., an optical amplifier. A light beam emitted by the optical semiconductor device 16 is band of wavelength of 780, 850, 1310, or 1550 nm.

A through hole 10a allowing a light beam to pass is formed in a part of the substrate 10 which faces a light-receiving window and a light exit window of the optical semiconductor device 16 on the substrate 10. For example, the diameter of the through hole 10a used for outputting a light beam or inputting a light beam is set at about 100 μm which is greater than the diameter of the light-receiving window and the light exit window of the optical semiconductor device 16.

A transparent thin plate 18 made of glass, a polymer, or an acrylic material, the plate having a micro lens 18L in the middle thereof is fixed in contact with another surface of the substrate 10. The micro lens 18L is inserted in one open end of the through hole 10a. A support section 22 is formed on a top surface of the transparent thin plate 18, the support section 22 being a cylindrical or rectangular parallelepiped body having a hole to be engaged with an open end of a connector housing 20 forming a part of a connector. In the middle of the support section 22, a micro hole 22a is formed to make an insertion of an end of a strand of an optical fiber 24 having a diameter of 125 μm guided through a hole of the connector housing 20. The strand of the optical fiber 24 disposed in the connector housing 20 is buckled to provide it with a curved section 24a at a part thereof apart from the micro hole 22a. Thus, light beams are communicated between the optical semiconductor 16 and the optical fiber 24 through the through-hole 10a and the micro lens 18L.

The substrate 11 is formed from a material similar to that of the substrate 10, e.g., a polyimide system or acrylic resin, silicon, glass, or a liquid crystal polymer in a predetermined thickness. On a surface region of the substrate 11 where the semiconductor device 26 and the electrical connector 28 are disposed, a high-speed electrical transmission path 11wb is formed, the path being electrically connected to the flexible cable 12 at one end thereof and connected to the semiconductor device 26 at another end thereof. High-speed electrical signals are transmitted over the high-speed electrical transmission path 11wb at a communication speed similar to the communication speed of the above-described high-speed electrical transmission path 11wa, e.g., at a communication speed (data transfer amount) not lower than 5 Gbps and not higher than 100 Gbps. The semiconductor device 26 and the electrical connector 28 are connected to each other by the high-speed electrical transmission path 11wa. Thus, the substrate 10 and the substrate 11 are electrically connected by the flexible cable 12 disposed between them, and the optical semiconductor device 16 and the semiconductor device 26 are therefore electrically connected to each other.

Figure 11:
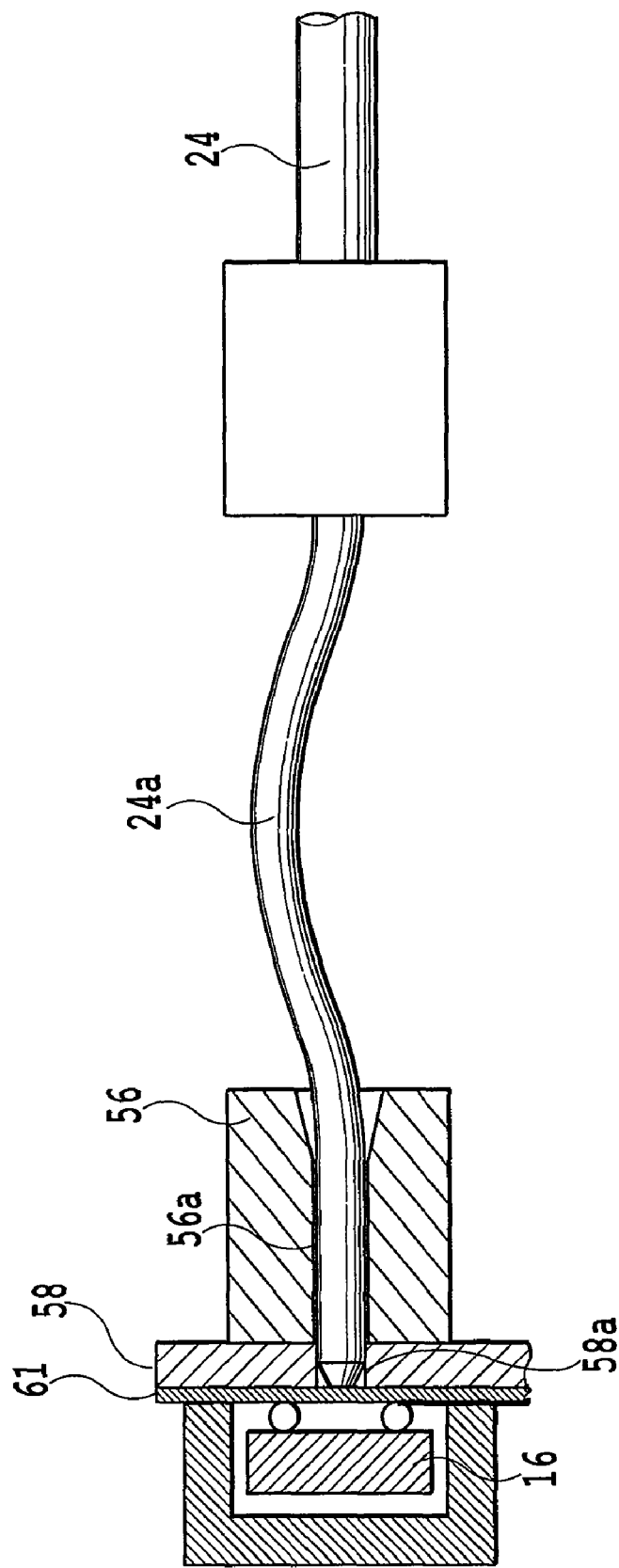
FIG. 11 is a partial sectional view made available for explaining a configuration for positioning an end of a strand of an optical fiber relative to a light-emitting section and a light-receiving section of an optical semiconductor device.

In such a configuration, when the connector housing 20 connected to the optical fiber 24 is engaged with the support section 22, the substrate 10 and the substrate 11 are disposed such that they are located on a common plane as shown in FIG. 11. That is, the optical semiconductor device 16 and the semiconductor device 26 are mounted on a common plane. As a result, the operation of connecting the connector housing 20 can be carried out with improved ease of handling.

Figure 2:
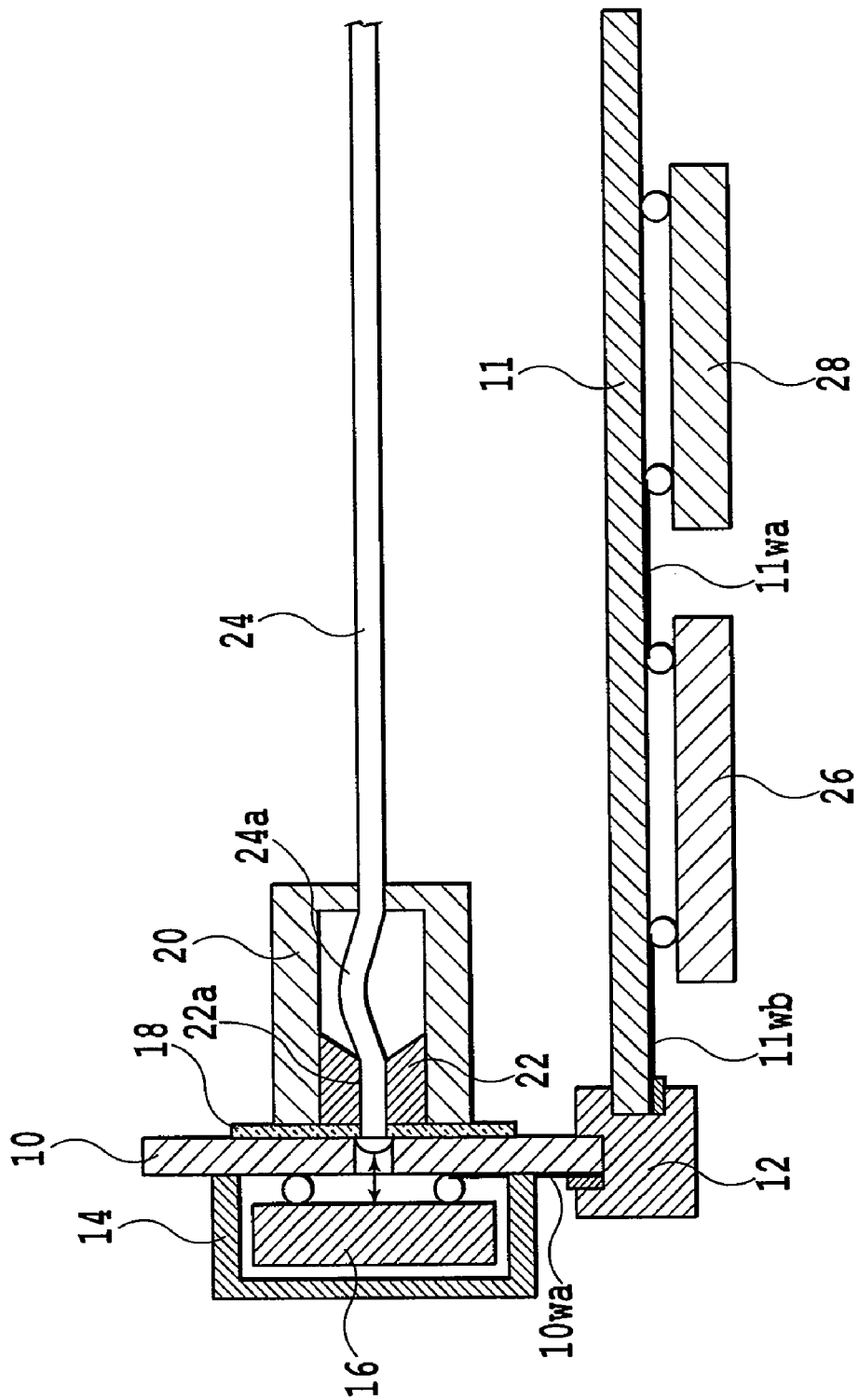
FIG. 2 is a sectional view made available for explaining operations in the example shown in FIG. 1.

On the contrary, when the semiconductor submodule is used with the optical fiber 24 disposed in a predetermined position, after the connector housing 20 is engaged with the supporting section 22 and the optical fiber 24 is connected with the substrate 10, the flexible cable 12 is folded such that a plane extending from a surface of the substrate 10 intersects a plane extending from a surface of the substrate 11 and such that the optical fiber 24 extends above the substrate 11, as shown in FIG. 2. At this time, the axis of the optical fiber 24 is substantially in parallel with a surface of the substrate 11.

Therefore, the substrate 10 is folded in the direction of the surface thereof opposite to the surface on which the optical semiconductor device 16 is mounted, and the optical fiber 24 is disposed above a back surface of the substrate 11. As a result, the connector and the optical fiber 24 can be simultaneously disposed above the substrate 11 and can therefore be used in a small space.

In the above-described example, one each optical semiconductor device 16, semiconductor device 26, and electrical connector 28 are typically shown on the substrate 10 and the substrate 11, respectively. However, such an example is not limiting, and a plurality of optical semiconductor devices 16, semiconductor devices 26, and electrical connectors 28 may alternatively be provided on the substrate 10 and the substrate 11, respectively.

Figure 3:
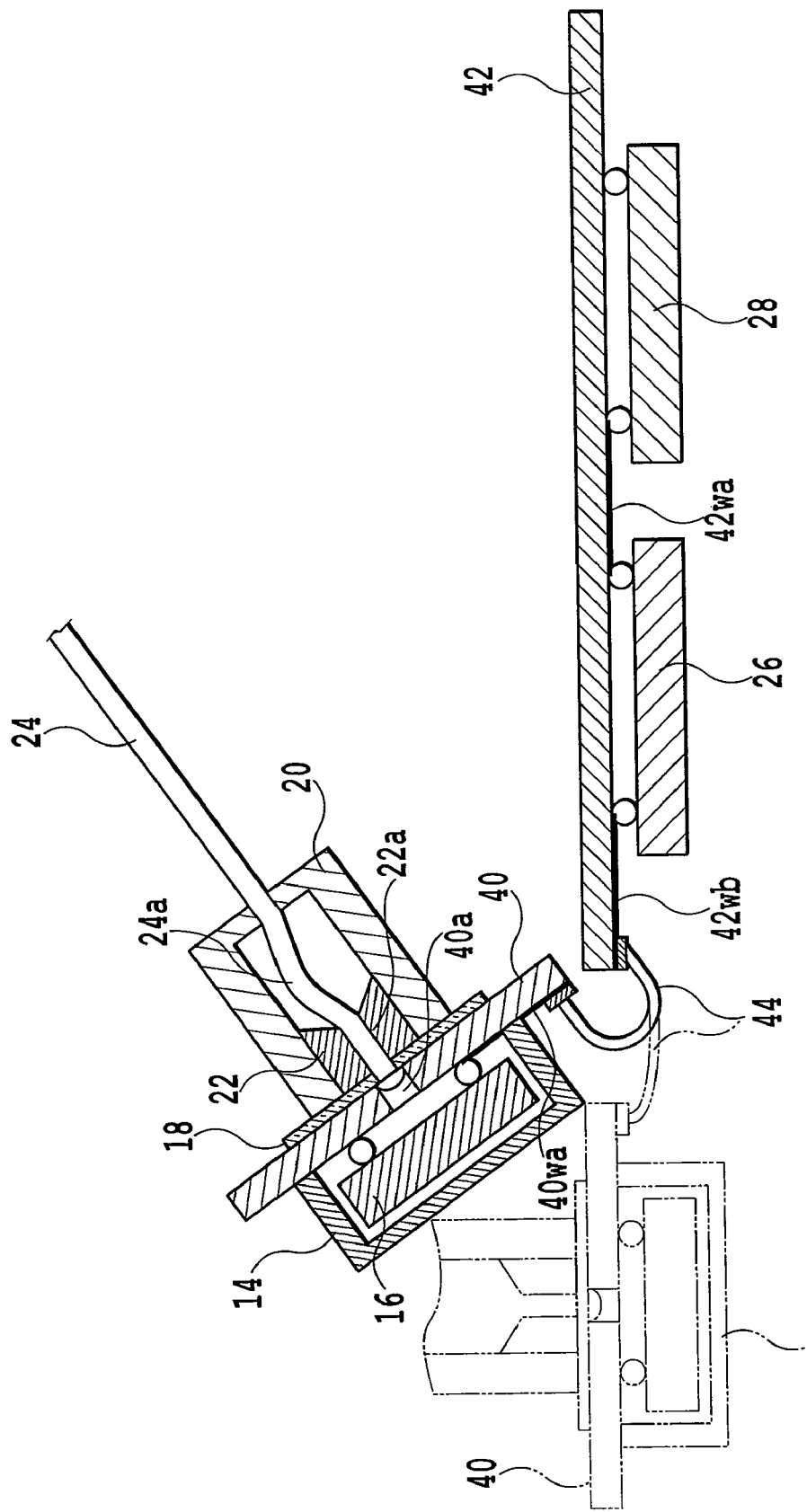
FIG. 3 is a sectional view schematically showing a general configuration of a second embodiment of a semiconductor submodule according to the present invention.

FIG. 3 schematically shows a general configuration of a second embodiment of the semiconductor submodule according to the present invention.

In FIG. 3 and in each of embodiments which will be described later, constituent elements identical to the constituent elements of the embodiment shown in FIGS. 1 and 2 are indicated by like reference numerals to avoid duplication of description.

Referring to FIG. 3, a semiconductor submodule includes a substrate 40 as a first substrate having an optical semiconductor device 16 on one surface thereof, a substrate 42 as a second substrate having a semiconductor device 26 for driving the optical semiconductor device 16 and for amplifying signals and an electrical connector 28 for inputting and outputting electrical signals between the semiconductor submodule and the outside, and a metal wire 44 as flexible connection means for electrically connecting an end of the substrate 40 and an end of the substrate 42.

The substrate 40 is formed from, for example, a polyimide system or acrylic resin, silicon, glass, or liquid crystal polymer in a predetermined thickness. On a surface region of the substrate 40 where the optical semiconductor device 16 is disposed, a high-speed electrical transmission path 40$wa$ is formed, the path being electrically connected to the metal wire 44 at one end thereof and connected to the optical semiconductor device 16 at another end thereof. For example, high-speed electrical signals are transmitted over the high-speed electrical transmission path 40$wa$ at a communication speed (data transfer amount) not less than 5 Gbps and not more than 100 Gbps.

A through hole 40$a$ allowing a light beam to pass is formed in a part of the substrate 40 which faces a light-receiving window and a light exit window of the optical semiconductor device 16 on the substrate. For example, the diameter of the through hole 40$a$ used for outputting a light beam or inputting a light beam is set at about 100 μm which is greater than the diameter of the light-receiving window and the light exit window of the optical semiconductor device 16.

The metal wire 44 is formed of a metal wire having resilient properties and formed with a desired thickness which enables electrical connection, e.g., the metal wire ranging from 10 to 150 μm in thickness.

The substrate 42 is formed from a material similar to that of the substrate 40, e.g., a polyimide system or acrylic resin, silicon, glass, or a liquid crystal polymer in a predetermined thickness. On a surface region of the substrate 42 where the semiconductor device 26 and the electrical connector 28 are disposed, a high-speed electrical transmission path 42$wb$ is formed, the path being electrically connected to the metal wire 44 at one end thereof and connected to the semiconductor device 26 at the other end thereof. High-speed electrical signals are transmitted over the high-speed electrical transmission path 42$wb$ at a communication speed similar to the communication speed of the above-described high-speed electrical transmission path 40$wa$, e.g., a communication speed (data transfer amount) not less than 5 Gbps and not more than 100 Gbps. The semiconductor device 26 and the electrical connector 28 are connected to each other by the high-speed electrical transmission path 42$wa$. Thus, the substrate 40 and the substrate 42 are electrically connected by the metal wire 44 disposed between them, and the optical semiconductor device 16 and the semiconductor device 26 are therefore electrically connected to each other.

In such a configuration, when the connector housing 20 connected to the optical fiber 24 is engaged with the support section 22, the substrate 40 and the substrate 42 are disposed such that they are located on a common plane as represented by the chain double-dashed lines in FIG. 3. Alternatively, they may be disposed such that a surface of the substrate 40 becomes oblique to a surface of the substrate 42 as represented by solid lines. As a result, the operation of connecting the connector housing 20 can be carried out with improved ease of handling.

On the contrary, when the semiconductor submodule is used with the optical fiber 24 disposed in a predetermined position, after the connector housing 20 is engaged with the supporting section 22 and the optical fiber 24 is connected with the substrate 40, the substrate 40 is raised such that a surface thereof becomes perpendicular to a surface of the substrate 42. As a result, the connector and the optical fiber 24 can be simultaneously disposed on or above the surface of the substrate 42, and the semiconductor submodule can therefore be used in a small space.

Figure 4:
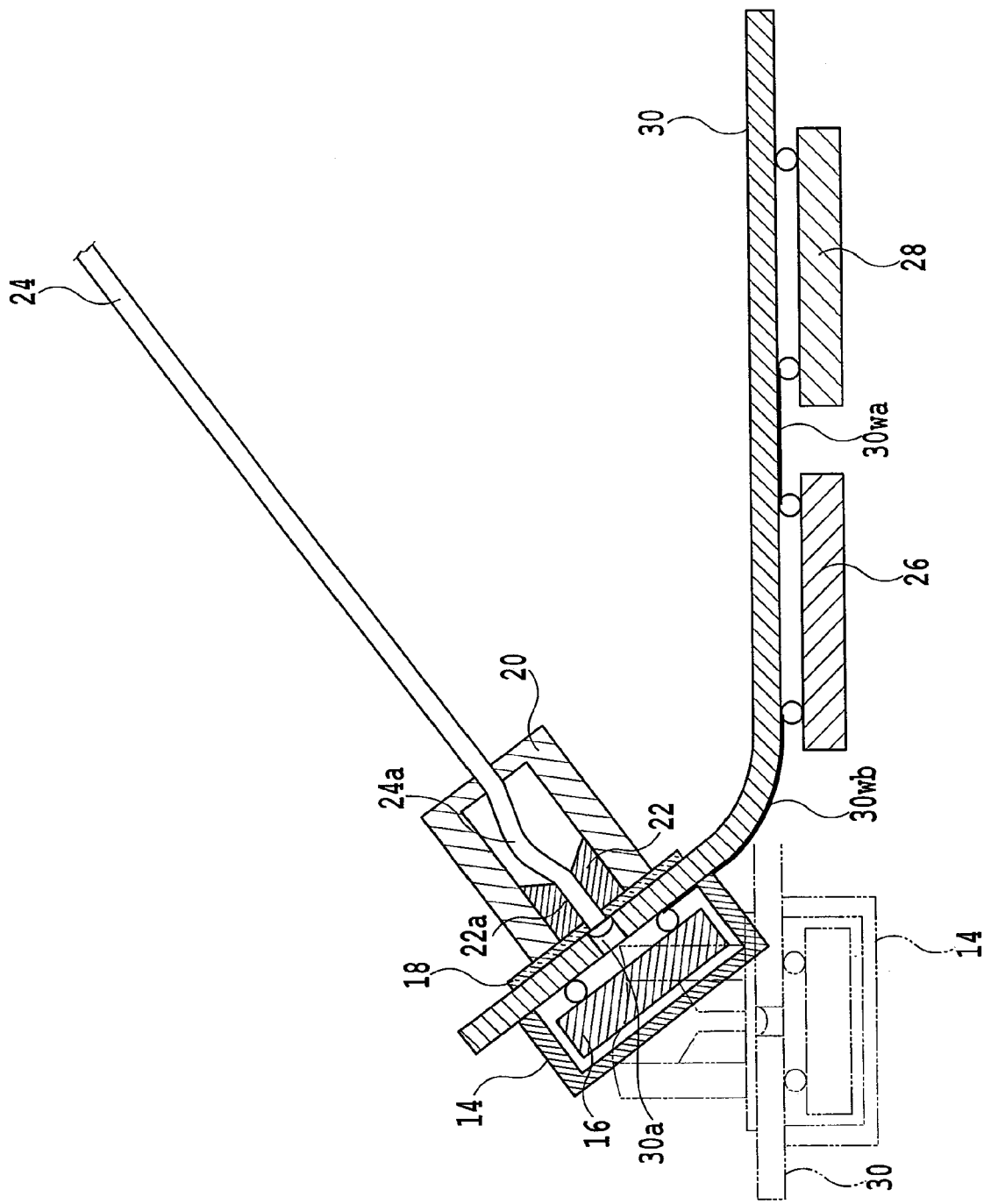
FIG. 4 is a sectional view schematically showing a general configuration of a third embodiment of a semiconductor submodule according to the present invention.

FIG. 4 schematically shows a general configuration of a third embodiment of the semiconductor submodule according to the present invention.

The embodiment shown in FIG. 4 is configured to include only one substrate 30 instead of a first substrate and a second substrate separate from each other as seen in the above-described embodiments.

The substrate 30 which can be bent because of flexible properties thereof is formed from, for example, a polyimide system or acrylic resin or a liquid crystal polymer in a predetermined thickness. On a surface region or a movable part of the substrate 30 on which the optical semiconductor device 16 is disposed, a high-speed electrical transmission path 30$wb$ is formed, the path being electrically connected to the optical semiconductor device 16 at one end thereof and connected to the semiconductor device 26 at the other end thereof. For example, high-speed electrical signals are transmitted over the high-speed electrical transmission path 30$wb$ at a communication speed (data transfer amount) not less than 5 Gbps and not more than 100 Gbps. A through hole 30$a$ is formed in a part of the substrate 30 facing the optical semiconductor device 16. The semiconductor device 26 and an electrical connector 28 provided adjacent to each other are connected by a high-speed electrical transmission path 30wa.

The portion of the substrate 30 located between the optical semiconductor device 16 and the semiconductor device 26 constitutes a movable section (a bend). The movable section can be displaced along with the high-speed electrical signal transmission path 30wb as indicated by the chain double-dashed lines and solid lines in FIG. 4.

Such an embodiment is similar to the above-described embodiment in that an optical fiber 24 and a connector can be always inserted and removed by handling them in a direction oblique to a horizontal surface of the substrate 30 on which the semiconductor device 26 and the electrical connector 28 are disposed because of the flexibility of the one common substrate 30. When the semiconductor submodule is used, a part of the substrate 30 is raised at the portion between the optical semiconductor device 16 and the semiconductor device 26 serving as the bend such that the surface of the part of the substrate 30 having the optical semiconductor device 16 provided thereon becomes substantially perpendicular to the above-described horizontal surface of the substrate 30, whereby the connector and the optical fiber 24 can be simultaneously disposed above the horizontal surface of the substrate 30. Therefore, the semiconductor submodule can be used in a small space.

Figure 25:
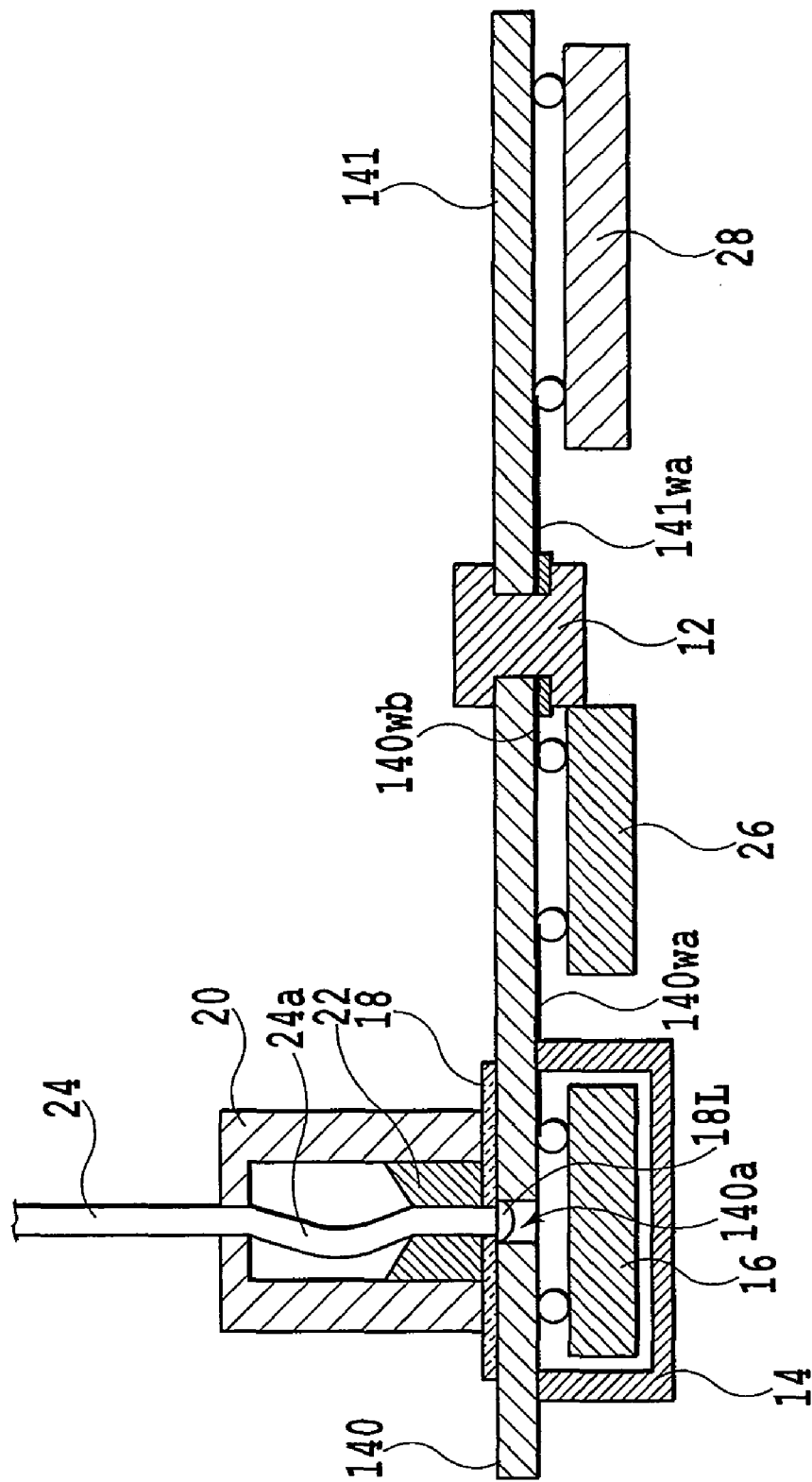
FIG. 25 is a sectional view schematically showing a general configuration of a fourth embodiment of the semiconductor submodule according to the present invention.
Figure 26:
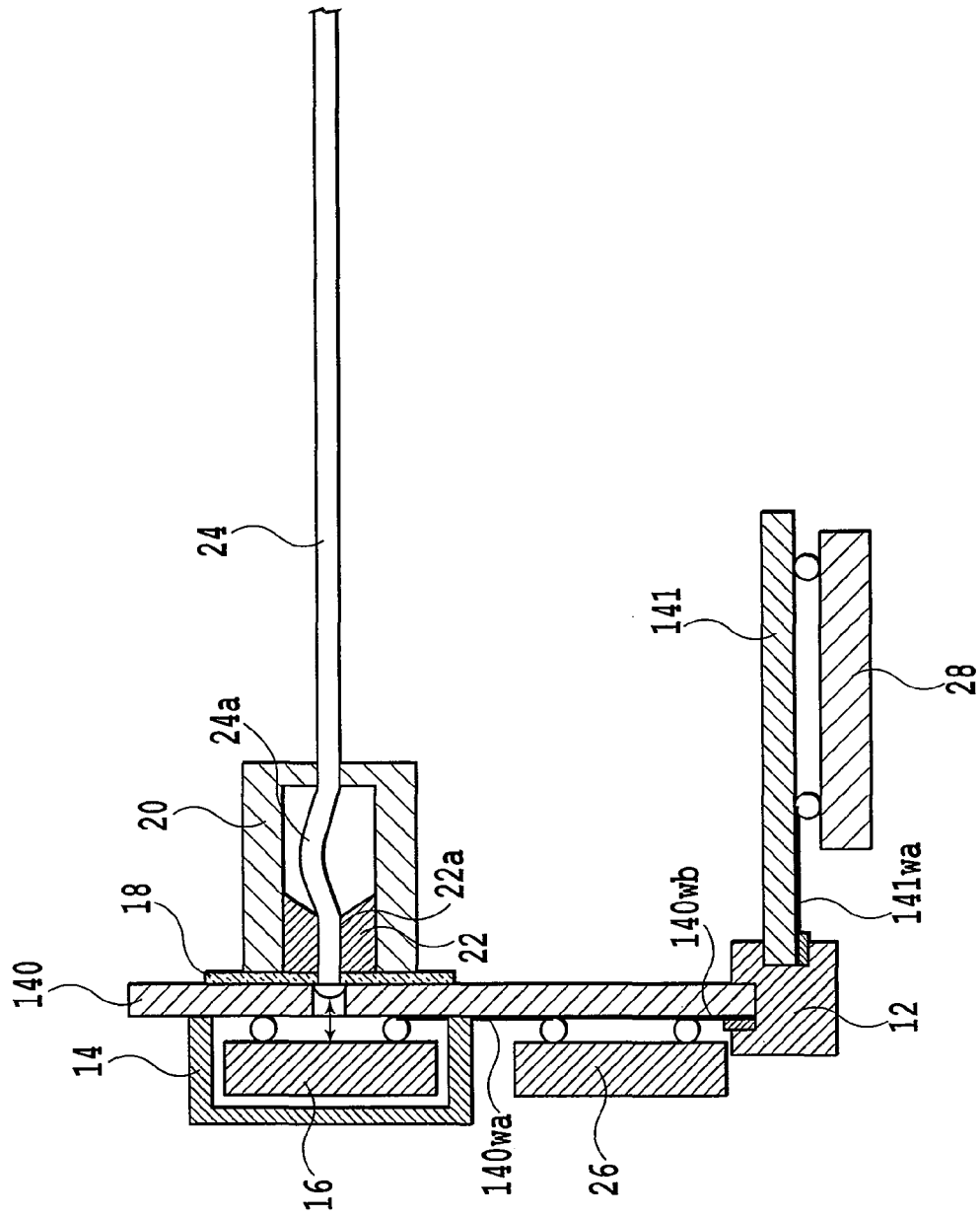
FIG. 26 is a sectional view made available for explaining an operation of the example shown in FIG. 25.

Each of FIGS. 25 and 26 schematically shows a general configuration of a fourth embodiment of the semiconductor submodule according to the present invention. The above-described first embodiment shown in FIG. 1 has a configuration in which the optical semiconductor device 16 is disposed on the substrate 10 as a first substrate and in which the semiconductor device 26 and the electrical connector 28 are disposed on the substrate 11 as a second substrate. The fourth embodiment has a configuration in which an optical semiconductor device 16 and a semiconductor device 26 are disposed on a substrate 140 as a first substrate and in which an electrical connector 28 is disposed on a substrate 141 as a second substrate.

Referring to FIG. 25, a semiconductor submodule includes a substrate 140 as a first substrate having an optical semiconductor device 16 and a semiconductor device 26 provided adjacent to each other on one surface thereof, a substrate 141 as a second substrate having an electrical connector 28 provided thereon, and a flexible cable 12 as flexible connection means for electrically connecting an end of the substrate 140 and an end of the substrate 141.

The substrate 140 is formed to have a predetermined thickness and is formed from, for example, a polyimide system or acrylic resin, silicon, glass, or liquid crystal polymer. On a surface region of the substrate 140 where the optical semiconductor device 16 is disposed, a high-speed electrical transmission path 140wa is formed, one end of the path being electrically connected to a solder ball terminal on one side of the semiconductor device 26, another end of the path being connected to a solder ball terminal of the optical semiconductor device 16. A high-speed electrical transmission path 140wb for electrically connecting the semiconductor device 26 and the flexible cable 12 is formed on the substrate 140 between a solder ball terminal on another side of the semiconductor device 26 and the flexible cable 12. For example, high-speed electrical signals are transmitted over the high-speed electrical transmission paths 140wa and 140wb at a communication speed (data transfer amount) not lower than 5 Gbps and not higher than 100 Gbps.

A predetermined interval to be kept between the optical semiconductor device 16 and the semiconductor device 26 (an interval between the solder ball terminals) to satisfy thermal design requirements is set smaller than that in the example shown in FIG. 1. Thus, the length of the high-speed electrical transmission path 140wa along the surface is smaller than that in the example shown in FIG. 1, and distortion of a signal in the high-speed electrical transmission path 140wa can be made less significant. Therefore, the substrate 140 has improved transmission efficiency.

A through hole 140a allowing a light beam to pass is formed in a part of the substrate 140 which faces a light-receiving window and a light exit window of the optical semiconductor device 16. For example, the diameter of the through hole 140a used for outputting a light beam or inputting a light beam is set at about 100 μm which is greater than the diameter of the light-receiving window and the light exit window of the optical semiconductor device 16.

The substrate 141 is formed to have a predetermined thickness and is formed from a material similar to that of the substrate 140, e.g., a polyimide system or acrylic resin, silicon, glass, or a liquid crystal polymer. On a surface region of the substrate 141 where an electrical connector 28 is disposed, a high-speed electrical transmission path 141wa is formed, the path being electrically connected to the flexible cable 12 at one end thereof and connected to the electrical connector 28 at another end thereof. High-speed electrical signals are transmitted over the high-speed electrical transmission path 141wa at a communication speed similar to the communication speed of the above-described high-speed electrical transmission paths 140wa and 140wb, e.g., a communication speed (data transfer amount) not lower than 5 Gbps and not higher than 100 Gbps. Thus, the substrate 140 and the substrate 141 are electrically connected by the flexible cable 12 disposed between them. Therefore, the optical semiconductor device 16 and the semiconductor device 26 are electrically connected to the electrical connector 28.

In such a configuration, when the connector housing 20 connected to the optical fiber 24 is engaged with the support section 22, the substrate 140 and the substrate 141 are disposed such that they are located on a common plane as shown in FIG. 25. That is, the optical semiconductor device 16, the semiconductor device 26 and the electrical connector 28 are mounted on a common plane. As a result, the operation of connecting the connector housing 20 can be carried out with improved ease of handling.

When the semiconductor submodule is used with the optical fiber 24 disposed in a predetermined position, after the connector housing 20 is engaged with the supporting section 22 and the optical fiber 24 is connected with the substrate 140, the flexible cable 12 is folded such that a plane extending from a surface of the substrate 140 intersects a plane extending from a surface of the substrate 141 and such that the optical fiber 24 extends above the substrate 141, as shown in FIG. 26. At this time, the axis of the optical fiber 24 is substantially in parallel with a surface of the substrate 141.

Therefore, the substrate 140 is folded in the direction of the surface thereof opposite to the surface on which the optical semiconductor device 16 is mounted, and the optical fiber 24 is disposed above a bottom surface of the substrate 141. As a result, the connector and the optical fiber 24 can be simultaneously disposed above the substrate 141 and can therefore be used in a small space.

In the above-described example, one each optical semiconductor device 16, semiconductor device 26, and electrical connector 28 are shown on the substrate 140 and the substrate 141, respectively, as typical features. However, such an example is not limiting, and plural optical semiconductor devices 16, semiconductor devices 26, and electrical connectors 28 may alternatively be provided on the substrate 140 and the substrate 141, respectively.

Figure 27:
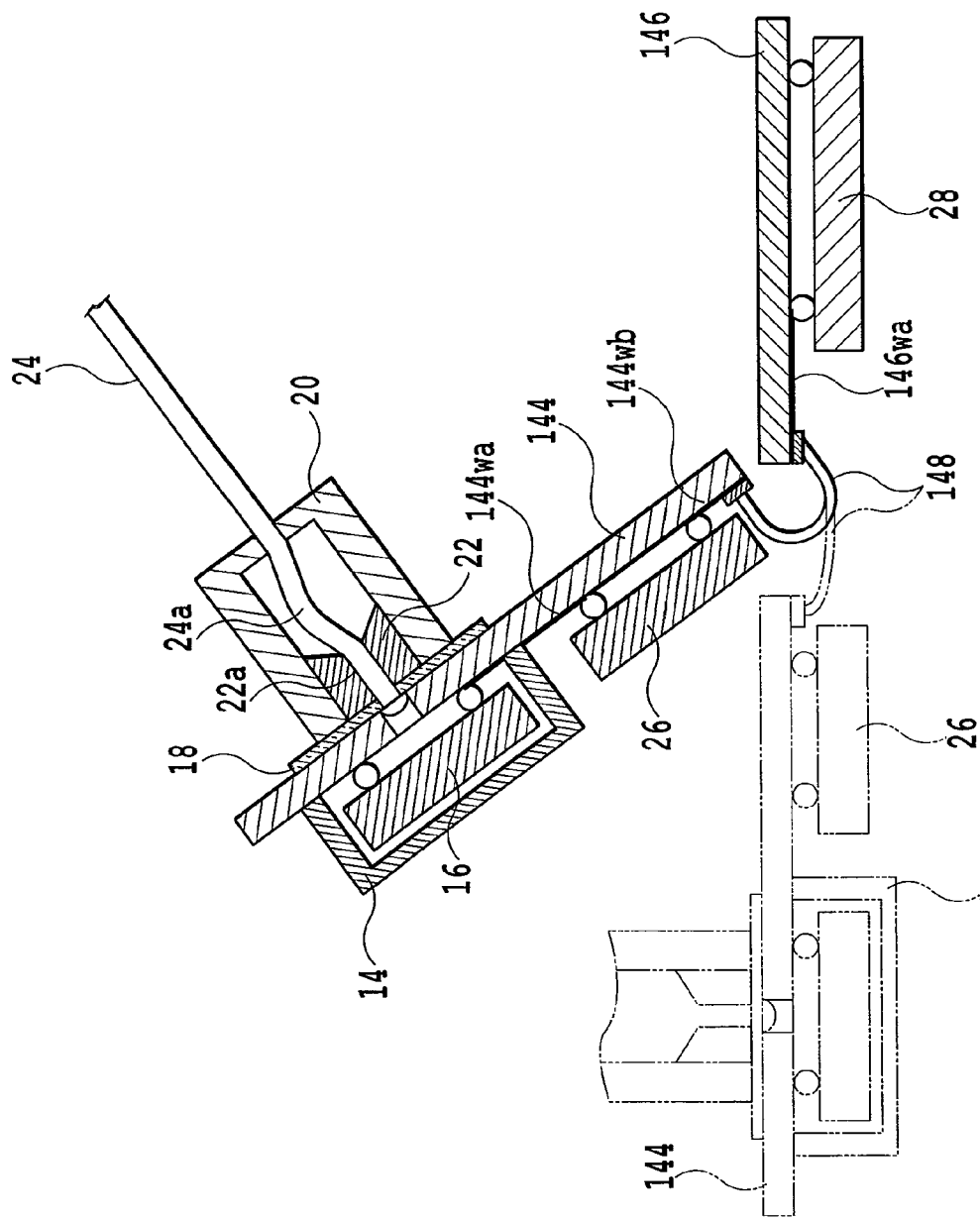
FIG. 27 is a sectional view schematically showing a general configuration of a fifth embodiment of the semiconductor submodule according to the present invention.

FIG. 27 schematically shows a general configuration of a fifth embodiment of the semiconductor submodule according to the present invention. The above-described second embodiment shown in FIG. 3 has a configuration in which the optical semiconductor device 16 is disposed on the substrate 40 as a first substrate and in which the semiconductor device 26 and the electrical connector 28 are disposed on the substrate 42 as a second substrate. The fifth embodiment has a configuration in which an optical semiconductor device 16 and a semiconductor device 26 are disposed on a substrate 144 as a first substrate and in which an electrical connector 28 is disposed on a substrate 146 as a second substrate.

Referring to FIG. 27, a semiconductor submodule includes a substrate 144 as a first substrate having an optical semiconductor device 16 and a semiconductor device 26 provided on one surface thereof, a substrate 146, as a second substrate, having an electrical connector 28 provided thereon, and a metal wire 148 as flexible connection means for electrically connecting an end of the substrate 144 and an end of the substrate 146.

The substrate 144 is formed to have a predetermined thickness and is formed from, for example, a polyimide system or acrylic resin, silicon, glass, or liquid crystal polymer. On a surface region of the substrate 144 where the optical semiconductor device 16 is disposed, a high-speed electrical transmission path 144wa is formed, one end of the path being electrically connected to a solder ball terminal on one side of the semiconductor device 26, another end of the path being connected to a solder ball terminal of the optical semiconductor device 16. A high-speed electrical transmission path 144wb for electrically connecting the semiconductor device 26 and the metal wire 148 is formed on the substrate 144 between a solder ball terminal on another side of the semiconductor device 26 and the metal wire 148. For example, high-speed electrical signals are transmitted over the high-speed electrical transmission paths 144wa and 144wb at a communication speed (data transfer amount) not lower than 5 Gbps and not higher than 100 Gbps.

A predetermined interval to be kept between the optical semiconductor device 16 and the semiconductor device 26 (an interval between the solder ball terminals) to satisfy thermal design requirements is set smaller than that in the example shown in FIG. 3. Thus, the length of the high-speed electrical transmission path 144wa along the surface is smaller than that in the example shown in FIG. 3, and distortion of a signal in the high-speed electrical transmission path 144wa can be made less significant. Therefore, the substrate 144 has improved transmission efficiency.

A through hole 144a allowing a light beam to pass is formed in a part of the substrate 144 which faces a light-receiving window and a light exit window of the optical semiconductor device 16. For example, the diameter of the through hole 144a used for outputting a light beam or inputting a light beam is set at about 100 µm which is greater than the diameter of the light-receiving window and the light exit window of the optical semiconductor device 16.

The metal wire 148 is a metal wire having resilient properties and formed with a desired thickness which enables electrical connection, e.g., a diameter in the range from 10 to 150 µm.

The substrate 146 is formed to have a predetermined thickness and is formed from a material similar to that of the substrate 144, e.g., a polyimide system or acrylic resin, silicon, glass, or a liquid crystal polymer. On a surface region of the substrate 146 where an electrical connector 28 is disposed, a high-speed electrical transmission path 146wa is formed, the path being electrically connected to the metal wire 148 at one end thereof and connected to the electrical connector 28 at another end thereof. High-speed electrical signals are transmitted over the high-speed electrical transmission path 146wa at a communication speed similar to the communication speed of the above-described high-speed electrical transmission paths 144wa and 144wb, e.g., a communication speed (data transfer amount) not lower than 5 Gbps and not higher than 100 Gbps. Thus, the substrate 144 and the substrate 146 are electrically connected by the metal wire 148 disposed between them. Therefore, the optical semiconductor device 16 and the semiconductor device 26 are electrically connected to the electrical connector 28.

In such a configuration, when the connector housing 20 connected to the optical fiber 24 is engaged with the support section 22, the substrate 144 and the substrate 146 are disposed such that they are located on a common plane as represented by the chain double-dashed lines in FIG. 27. Alternatively, they may be disposed such that a surface of the substrate 144 becomes oblique to a surface of the substrate 146 as represented by the solid lines. As a result, the operation of connecting the connector housing 20 can be carried out with improved ease of handling.

When the semiconductor submodule is used with the optical fiber 24 disposed in a predetermined position, after the connector housing 20 is engaged with the supporting section 22 and the optical fiber 24 is connected with the substrate 144, the substrate 144 is folded such that a surface of the same becomes perpendicular to a surface of the substrate 146. Thus, the connector and the optical fiber 24 can be simultaneously disposed on or above the surface of the substrate 146. The semiconductor submodule can therefore be used in a small space.

FIG. 28 schematically shows a general configuration of a sixth embodiment of the semiconductor submodule according to the present invention.

In the third embodiment shown in FIG. 4, the section of the substrate 30 located between the optical semiconductor device 16 and the semiconductor device 26 constitutes a movable section (bending section), and the section can be displaced along with the high-speed electrical signal transmission path 30wb. The sixth embodiment has a configuration in which a section of a substrate 150 located between a semiconductor device 26 and an electrical connector 28 constitutes a movable section (bending section) and in which the section can be displaced along with a high-speed electrical transmission path 150wa.

The substrate 150 which can be bent because of flexible properties thereof is formed to have a predetermined thickness and is formed from, for example, a polyimide system or acrylic resin or a liquid crystal polymer. On a surface region of the substrate 150 where an optical semiconductor device 16 and a semiconductor device 26 are disposed, a high-speed electrical transmission path 150wb is formed, one end of the path being connected to a solder ball terminal of the optical semiconductor device 16, another end of the path being electrically connected to a solder ball terminal on one side of the semiconductor device 26. On the same surface region as the surface region where the above-described movable section is provided, a high-speed electrical transmission path 150wa is formed, one end of the path being connected to a solder ball terminal on another side of the semiconductor device 26, another end of the path being electrically connected to the electrical connector 28. High-speed electrical signals are transmitted over the high-speed transmission paths 150wa and 150wb at, for example, a communication speed (data transfer amount) not lower than 5 Gbps and not higher than 100 Gbps.

As thus described, a predetermined interval to be kept between the optical semiconductor device 16 and the semiconductor device 26 (an interval between the solder ball terminals) to satisfy thermal design requirements is set smaller than that in the example shown in FIG. 4. Thus, the length of the high-speed electrical transmission path 150wb along the surface is smaller than that in the example shown in FIG. 4, and distortion of a signal in the high-speed electrical transmission path 150wb can be made less significant. Therefore, the substrate 150 has improved transmission efficiency. A through hole 150a is formed in a part of the substrate 150 which faces the optical semiconductor device 16.

The section of the substrate 150 located between the semiconductor device 26 and the electrical connector 28 constitutes a movable section (bending section), and the section can be displaced along with the high-speed electrical transmission path 150wa as indicated by the chain double-dashed lines and solid lines in FIG. 28.

Such an embodiment is similar to the above-described embodiment in that an optical fiber 24 and a connector can be always inserted and removed by handling them in a direction oblique to a horizontal surface of the substrate 150 on which the electrical connector 28 is disposed because of the bendability of the one common substrate 150. When the semiconductor submodule is used, a part of the substrate 150 is folded at the section between the semiconductor device 26 and the electrical connector 28 serving as a bending section such that the surface of the part of the substrate 150 having the optical semiconductor device 16 provided thereon becomes substantially perpendicular to the above-described horizontal surface of the substrate 150, whereby the connector and the optical fiber 24 can be simultaneously disposed above the horizontal surface of the substrate 150. Therefore, the semiconductor submodule can be used in a small space.

(B) Method for Connecting Connector and Semiconductor Submodule

Figure 5A:
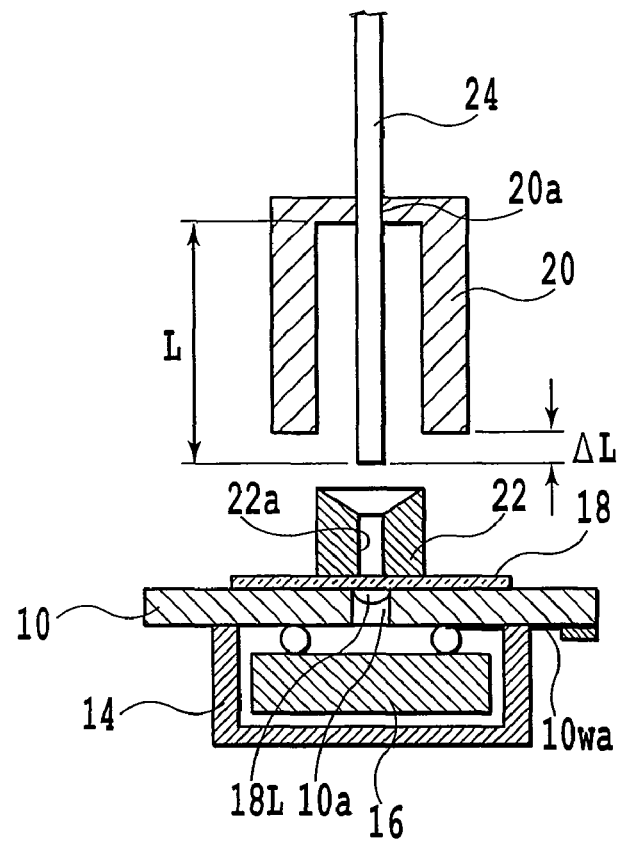
FIG. 5A is a partial sectional view of a connector and a substrate for which a first embodiment of a method for connecting a connector and a semiconductor submodule according to the present invention is used.
Figure 5B:
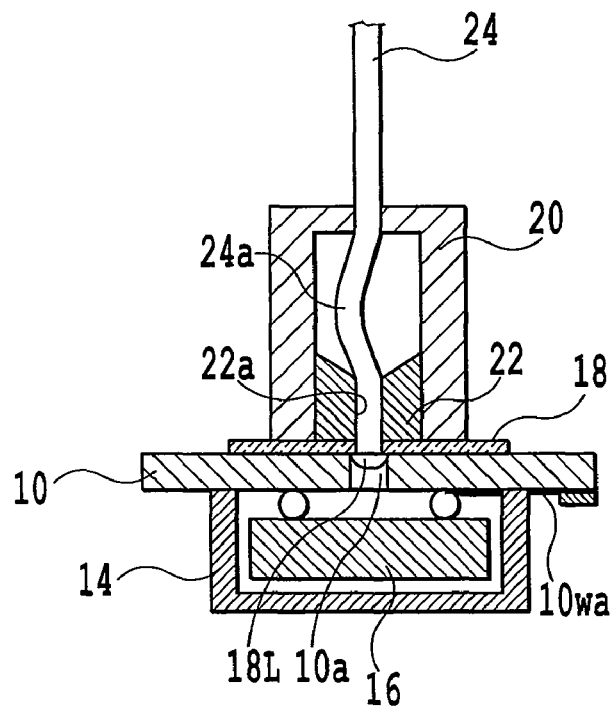
FIG. 5B is a partial sectional view of the connector and the substrate for which the first embodiment of the method for connecting a connector and a semiconductor submodule according to the present invention is used.

Each of FIGS. 5A and 5B are enlarged views of a connector and a substrate to which a first embodiment of a method for connecting a connector and a semiconductor submodule according to the present invention is applied.

FIGS. 5A and 5B show an example of disposition of a connector housing and a support section having a micro hole which can be used in the above-described first to third embodiments of the semiconductor submodule.

One end of a strand of an optical fiber 24 is inserted into a connector housing 20 through a hole 20a. When the connector housing 20 is not connected with a support section 22 of a substrate 10 or when an inner perimeter wall of the connector housing 20 is not engaged with the support section 22, a flexing length L of the end of the strand of the optical fiber 24 is set at, for example, 7 to 10 mm. The end of the strand of the optical fiber 24 protrudes from an open end of the connector 20 by a protruding length ΔL. For example, the protruding length ΔL is set in the excess of 0 and not greater than 100 μm. The inner diameter of a micro hole 22a of the support section 22 is set at a value which is substantially the same as the outer diameter of the optical fiber 24, e.g., a value in the range from 125 μm to 125.5 μm. A conical surface having a predetermined angle is formed at one open end of the micro hole 22a of the support section 22.

In such a configuration, when the inner circumferential part of the connector housing 20 is engaged with the support section 22, as shown in FIG. 5B, the end of the strand of the optical fiber 24 extends through the micro hole 22a to contact with a surface of a micro lens 18L or a transparent thin plate 18.

When the end face of the open part of the connector housing 20 is bonded to or touched on the surface of the transparent thin plate 18 at this time, the strand of the optical fiber 24 is buckled in the connector housing 20. As a result, a curved section 24a is formed between the open end of the micro hole 22 and the end of the perimeter wall of the connector housing 20 defining the hole 20a.

Therefore, the end face of the strand of the optical fiber 24 is always secured on the micro lens 18L in tight contact therewith by a constant pressing force. As a result, an optical connecting section having stable light input/output characteristics can be easily obtained.

Figure 6A:
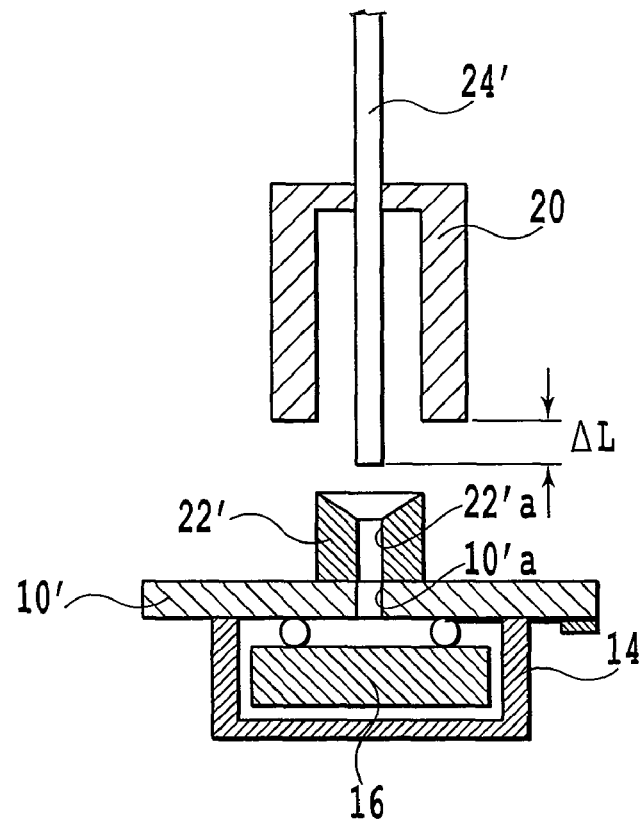
FIG. 6A is a partial sectional view of a connector and a substrate for which a second embodiment of the method for connecting a connector and a semiconductor submodule according to the present invention is used.
Figure 6B:
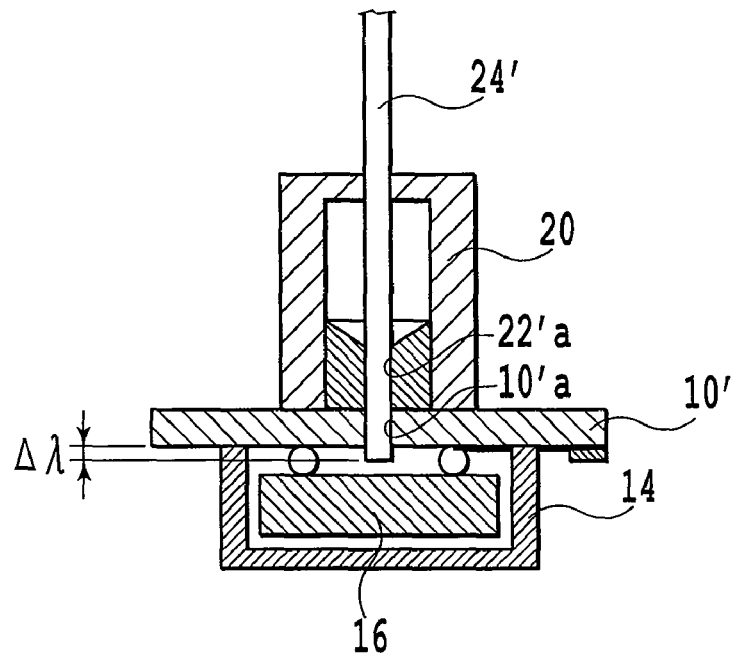
FIG. 6B is a partial sectional view of the connector and the substrate for which the second embodiment of the method for connecting a connector and a semiconductor submodule according to the present invention is used.

FIGS. 6A and 6B show a connector and a substrate to which a second embodiment of the method for connecting a connector and a semiconductor submodule according to the present invention is applied.

The example shown in FIGS. 6A and 6B is an example of disposition of a connector housing and a support section having a micro hole which can be used in the above-described first to third embodiments of the semiconductor submodule.

The example shown in FIGS. 6A and 6B is different from the above-described first embodiment in that the transparent thin plate 18 is removed.

The outer diameter of a strand of an optical fiber 24' is made precisely coincide with the inner diameter of a hole 10'a provided on a substrate 10'. Thus, an end of the strand of the optical fiber 24' passed through the micro hole 22'a is secured on the substrate 10'. The strand of the optical fiber 24' protrudes out the end face of the opening section of the connector housing 20 in an amount ΔL which is adjusted at a predetermined length Δλ such that the strand does not collides with a surface of an optical semiconductor device 16 when the connector housing 20 is brought into intimate contact with a back surface side of the substrate 10'.

Dimensions of the optical fiber 24', the substrate 10', and the support section 22' are set such that the optical fiber 24', the substrate 10', and the support section 22' have shapes similar to those of the above-described optical fiber 24, substrate 10, and support section 22.

Figure 7A:
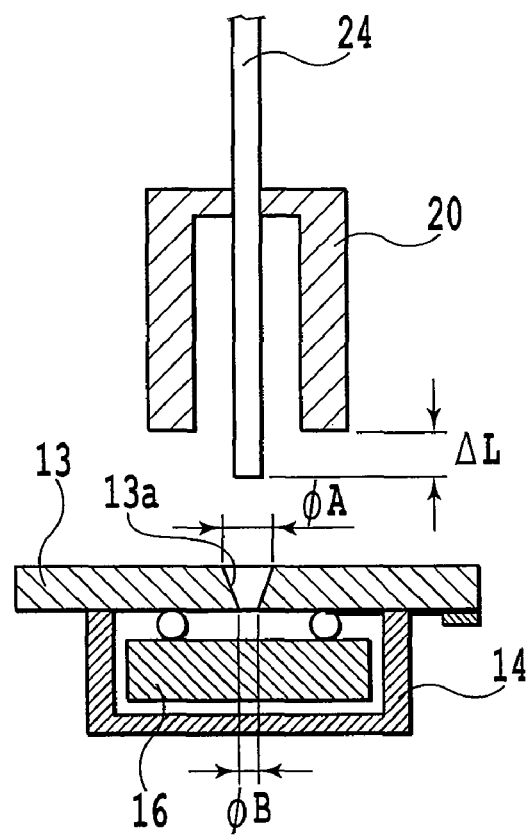
FIG. 7A is a partial sectional view of a connector and a substrate for which a third embodiment of the method for connecting a connector and a semiconductor submodule according to the present invention is used.
Figure 7B:
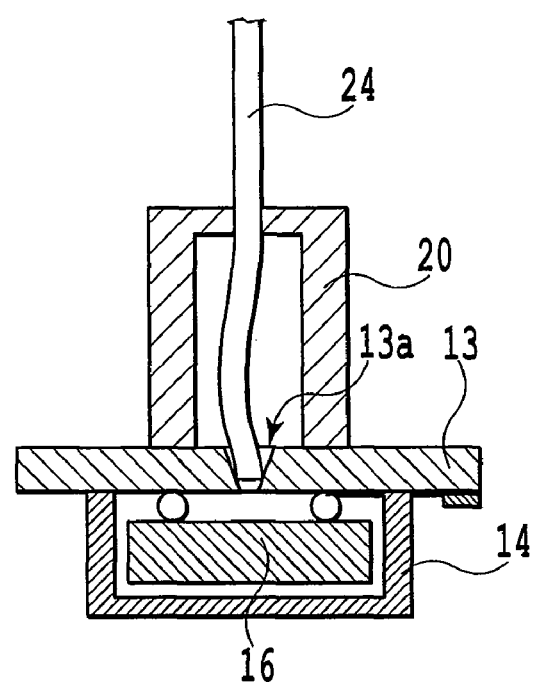
FIG. 7B is a partial sectional view of the connector and the substrate for which the third embodiment of the method for connecting a connector and a semiconductor submodule according to the present invention is used.

Each of FIGS. 7A and 7B shows a connector and a substrate to which a third embodiment of the method for connecting a connector and a semiconductor submodule according to the present invention is applied.

The example shown in FIG. 7A is an example of disposition of a connector housing and a support section which can be used in the above-described first to third embodiments of the semiconductor submodule.

The example shown in FIG. 7A is different from the above-described first embodiment in that the transparent thin plate 18 and the support section having a micro hole are removed.

The connector housing 20 is provided with a desired height along the axis of an optical fiber 24 to prevent positioning fluctuations of a strand of the optical fiber 24. When the connector housing 20 is not connected with a substrate 13, as shown in FIG. 7B, a strand of the optical fiber 24 protruding from an end face of an opening section of the connector housing 20 has a protruding amount ΔL which is adjusted to a desired length such that the strand does not collide with a surface of an optical semiconductor device 16 when the end face of the connector housing 20 is brought into intimate contact (bonded) with a bottom surface of the substrate 13. A truncated cone shaped hole 13a is formed on the substrate 13 in a face-to-face relationship with a light-emitting section and a light-receiving section of an optical semiconductor device 16. One open end of the tapered hole 13a formed on the side of the connector housing 20 has a diameter φA which is set at, for example, 150 μm. The other open end of the hole 13a has a diameter φB which is set at 100 μm. The configuration of the substrate 13 is similar to the above-described configuration of the substrate 10 except for the shape of the hole.

Thus, the outer diameter of the strand of the optical fiber 24 having an outer diameter of 125 μm is made to precisely coincide with the inner diameter of the hole 13a provided in the substrate 13 to position and secure the strand of the optical fiber relative to the light-emitting section and the light-receiving section of the optical semiconductor device 16.

FIGS. 8 to 11 show configurations for positioning an end of a strand of an optical fiber 24 relative to a light-emitting section and a light-receiving section of an optical semiconductor device 16 where a transparent thin plate 18 as described above is not used on a substrate having a support section to be selectively engaged with a connector housing as described above. Referring to the optical fiber 24, the end of the optical fiber is tapered to allow smooth insertion of the same into a micro hole.

Figure 8:
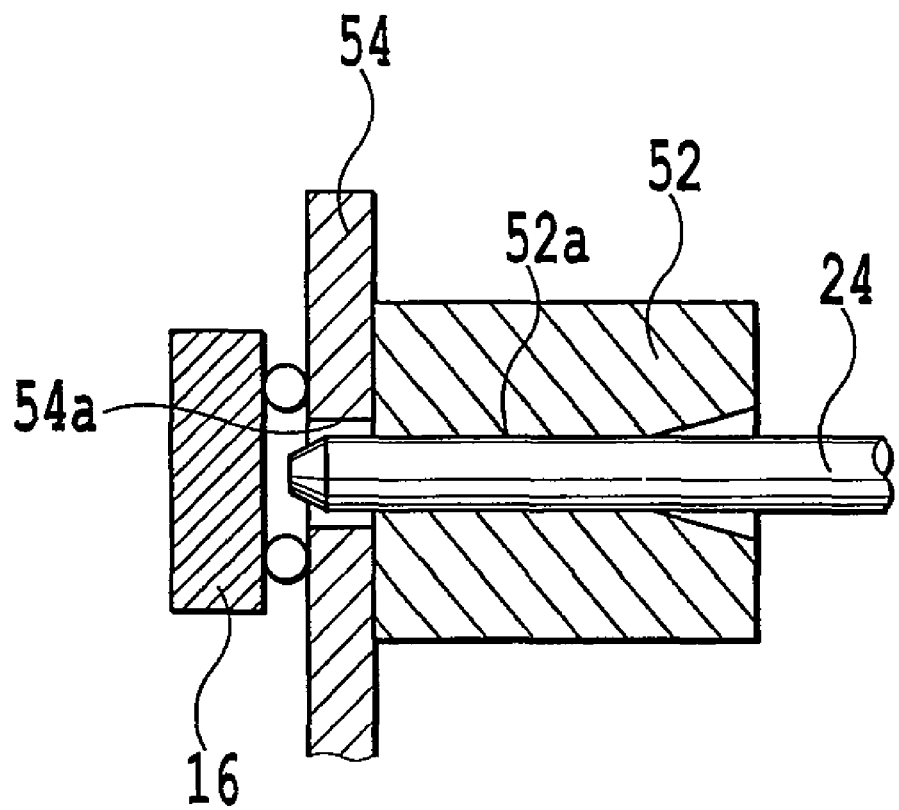
FIG. 8 is a partial sectional view made available for explaining a configuration for positioning an end of a strand of an optical fiber relative to a light-emitting section and a light-receiving section of an optical semiconductor device.

Referring to FIG. 8, the inner diameter of a through hole 54a of a substrate 54 is set slightly larger than the outer diameter of the optical fiber 24. A micro hole 52a of a support section 52 has an inner diameter which is set substantially equal to the outer diameter of the optical fiber 24. As a result, the end of the strand of the optical fiber 24 can be positioned relative to a light-emitting section and a light-receiving section of an optical semiconductor device 16.

Figure 9:
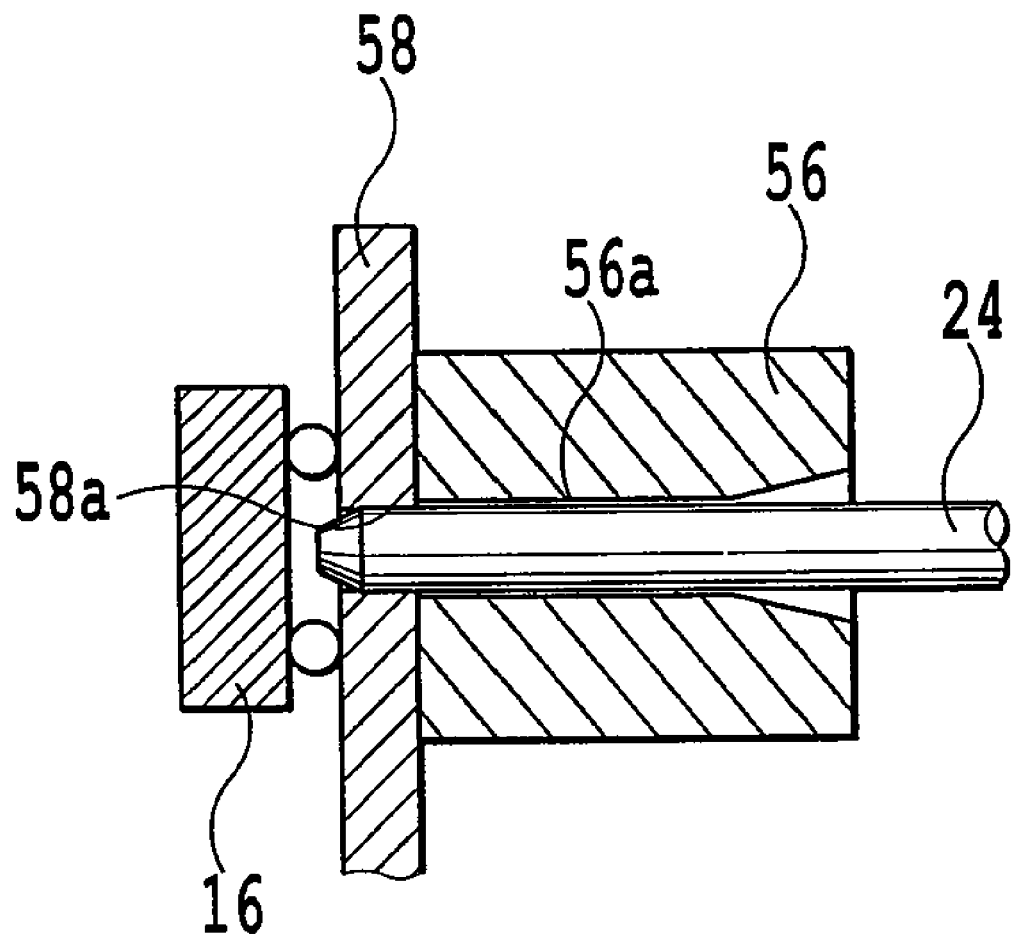
FIG. 9 is a partial sectional view made available for explaining a configuration for positioning an end of a strand of an optical fiber relative to a light-emitting section and a light-receiving section of an optical semiconductor device.

Referring to FIG. 9, the inner diameter of a through hole 58a of a substrate 58 is set substantially equal to the outer diameter of an optical fiber 24. The inner diameter of a micro hole 56a of a support section 56 is set slightly greater than the outer diameter of the optical fiber 24. Thus, the micro hole 56a of the support section 56 has the function of helping or assisting the insertion of the optical fiber 24 into the through hole 58a of the substrate 58, and the tip of the strand of the optical fiber is positioned relative to a light-emitting section and a light-receiving section of an optical semiconductor device 16 by the through hole 58a of the substrate 58.

Therefore, the examples shown in FIGS. 8 and 9 are advantageous when applied to an optical semiconductor device requiring no hermetically sealed in that the structure of the element can be simplified. Further, higher optical coupling efficiency can be achieved because the tip of the optical fiber can be put closer to the light-emitting section and the light-receiving section of the optical semiconductor device 16.

The through hole 58a of the substrate 58 can be provided with high positional accuracy because it can be formed with high accuracy using etching. When positioning is carried out using the through hole 58a of the substrate 58, the mounting accuracy of the optical semiconductor device 16 and the substrate 58 is improved. Therefore, the strand of the optical fiber 24 and the optical semiconductor device 16 can be positioned with higher accuracy to achieve higher optical coupling efficiency. A high technique is required to form a hole of high precision on a substrate as described above. Therefore, the structure of the example shown in FIG. 8 is appropriate when such a technique is not used.

Figure 10:
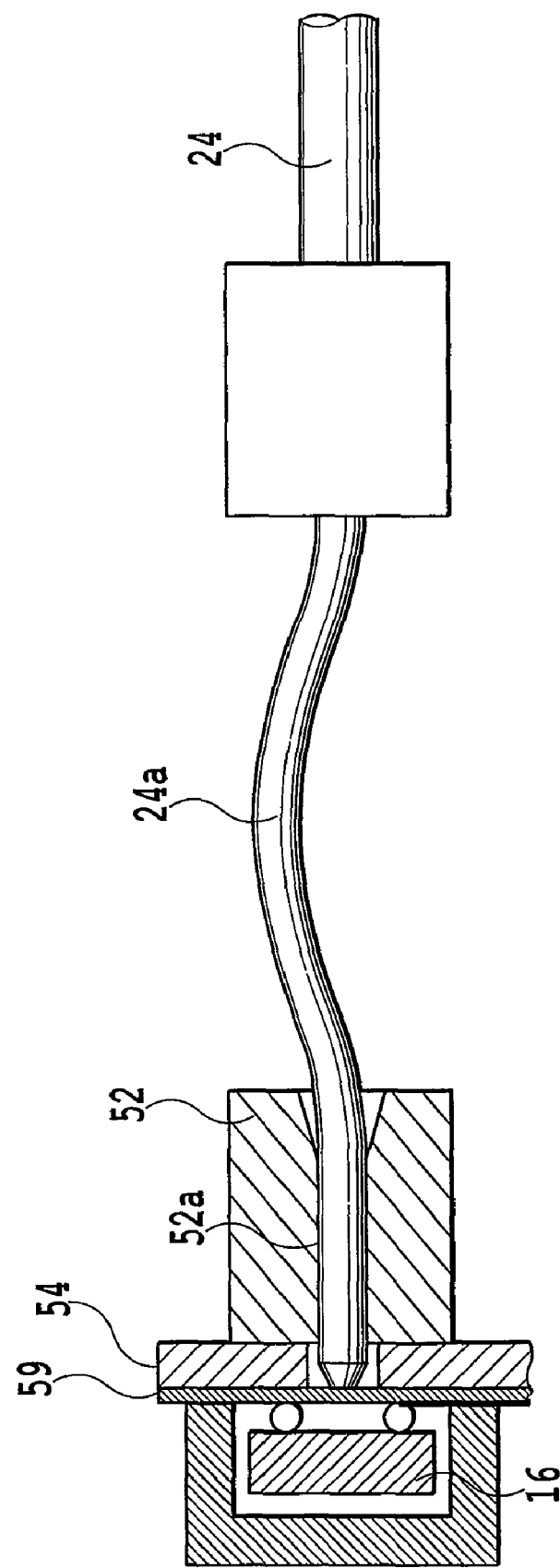
FIG. 10 is a partial sectional view made available for explaining a configuration for positioning an end of a strand of an optical fiber relative to a light-emitting section and a light-receiving section of an optical semiconductor device.

The examples shown in FIGS. 10 and 11 involve respective substrates 54 and 58 which are made of silicon. The substrates 54 and 58 are formed with silicon oxide films 59 and 61, respectively, on their surfaces having optical semiconductor devices 16 provided thereon. Thus, structures to enclose the optical semiconductor devices 16 can be provided.

Referring to FIG. 10, the inner diameter of a through 54a of a substrate 54 is set slightly larger than the outer diameter of an optical fiber 24. The inner diameter of a micro hole 52a of a support section 52 is set substantially equal to the outer diameter as the optical fiber 24. Thus, the tip of the strand of the optical fiber 24 can be positioned relative to a light-emitting section and a light-receiving section of an optical semiconductor device 16.

Referring to FIG. 11, the inner diameter of a through hole 58a of a substrate 58 is set substantially equal to the outer diameter of an optical fiber 24. The inner diameter of a micro hole 56a of a support section 56 is set slightly larger than the outer diameter of the optical fiber 24.

Referring to FIGS. 10 and 11, parts of the optical fibers 24 located upstream of the support sections 52 and 56 are deflected by a predetermined axial force such that the tips of the strands of the optical fibers 24 are touched on silicon oxide films 59 and 61. As a result, curved sections 24a are formed in the parts of the optical fiber 24 located upstream of the support sections 52 and 56.

(C) Optical Module

Figure 12A:
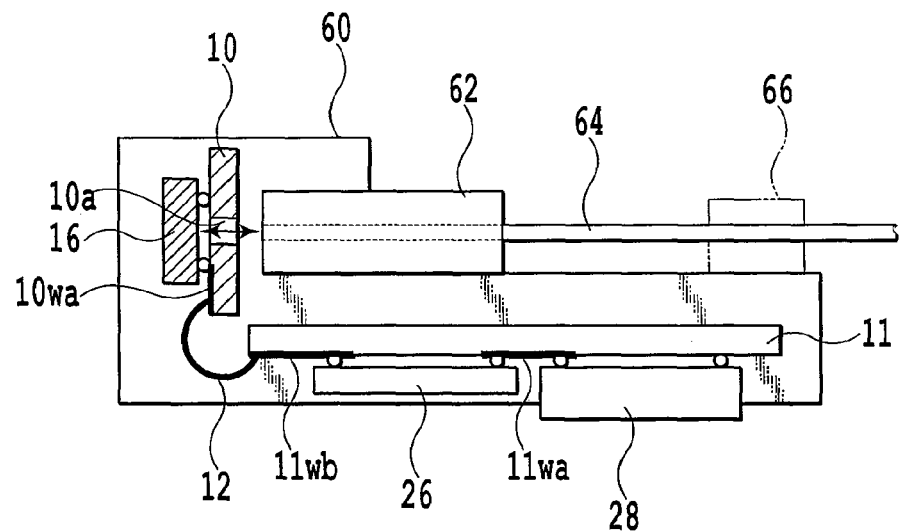
FIG. 12A is an illustration schematically showing a general configuration of a first embodiment of an optical module according to the present invention.

FIG. 12A schematically shows a general configuration of a first embodiment of the optical module according to the present invention.

The optical module shown in FIG. 12A includes a substrate 10, as a first substrate, having an optical semiconductor device 16 constituting a semiconductor submodule as described above and shown in FIG. 1 on one surface thereof, a substrate 11 as a second substrate having a semiconductor device 26 for driving the optical semiconductor device 16 and amplifying signals and an electrical connector 28 for inputting and outputting electrical signals with respect to the outside, and a flexible cable 12 as flexible connection means for electrically connecting an end of the substrate 10 and an end of the substrate 11. FIG. 12A shows a set of typical features, i.e., an optical semiconductor device 16, an optical fiber 64, and a connector 62.

The substrate 10 is fixed substantially perpendicularly to the substrate 11 by a casing 60 forming an outer wall of the optical module such that a plane extending from a surface of the substrate intersects a plane extending from a surface of the substrate 11. A receptacle for disposing a connector 62 to be connected with an optical fiber 64 is provided on the casing 60 in a position in a face-to-face relationship with the surface of the substrate 10. For example, the connector 62 is a connector having a connector housing and a support section as shown in FIGS. 5A to 7A.

As a result, the connector 62 is contained in a part of the casing 60 located above the substrate 11, and the optical fiber 64 is disposed such that the axis thereof becomes substantially parallel to the surface of the substrate 11. Thus, the optical module can be provided with a small size.

Figure 12B:
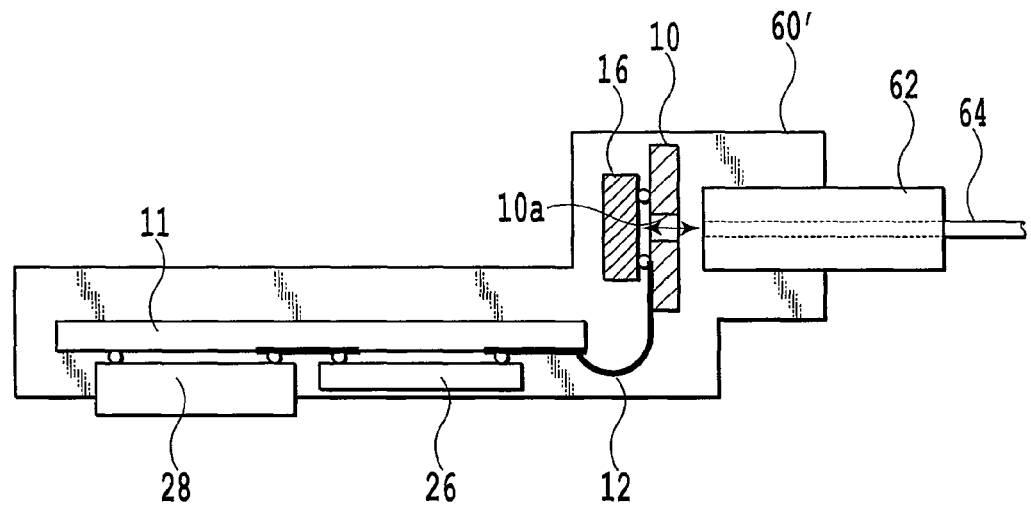
FIG. 12B is an illustration showing a configuration of an example for reference.

In comparison to a case wherein a connector 62 is disposed at an end of a casing 60' instead of being disposed above a substrate 11 as seen in the example for reference shown in FIG. 12B, the present embodiment makes it possible to provide an optical module with a smaller size because the connector 62 protrudes from the end of the casing 60' in a smaller amount.

Further, a retention mechanism 66 for retaining the optical fiber 64 to prevent an external force acting on the fiber from being applied to the connector 62 may be provided on a part of the casing 60 located above the substrate 11 as indicated by the chain double-dashed line in FIG. 12A.

Figure 13A:
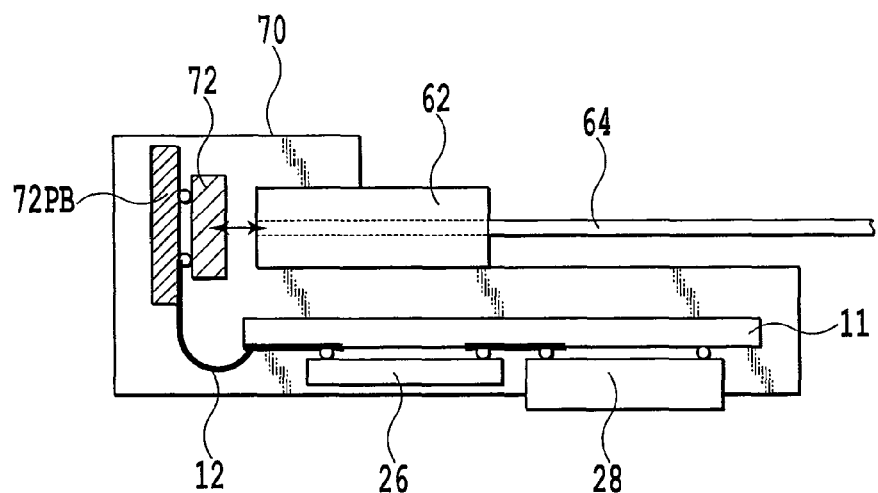
FIG. 13A is an illustration schematically showing a general configuration of a second embodiment of the optical module according to the present invention.

FIG. 13A schematically shows a general configuration of a second embodiment of the optical module according to the present invention.

In the example shown in FIG. 13A, an optical semiconductor 72 is disposed on a substrate 72PB instead of the substrate 10 and the optical semiconductor device 16 in FIG. 12A. Since the optical semiconductor device 72 is an optical semiconductor device of the type emitting at a surface opposite to electrodes, in the present embodiment, a light beam is not required to travel through a substrate 10 as described above.

FIG. 13A shows a set of typical features, i.e., a combination of an optical semiconductor device 72, an optical fiber 64, and a connector 62.

The substrate 72PB is fixed substantially perpendicularly to a substrate 11 by a casing 70 forming an outer wall of the optical module such that a plane extending from a surface of the substrate intersects a plane extending from a surface of the substrate 11. A connector 62 to be connected with an optical fiber 64 is disposed on the casing 70 in a position in a face-to-face relationship with the surface of the substrate 72B. For example, the connector 62 is a connector having a connector housing and a support section as shown in FIGS. 5A to 7A.

As a result, the connector 62 is contained in a part of the casing 60 located above the substrate 11, and the optical fiber 64 is disposed such that the axis thereof becomes substantially parallel to the surface of the substrate 11. Thus, the optical module can be provided with a small size.

Figure 13B:
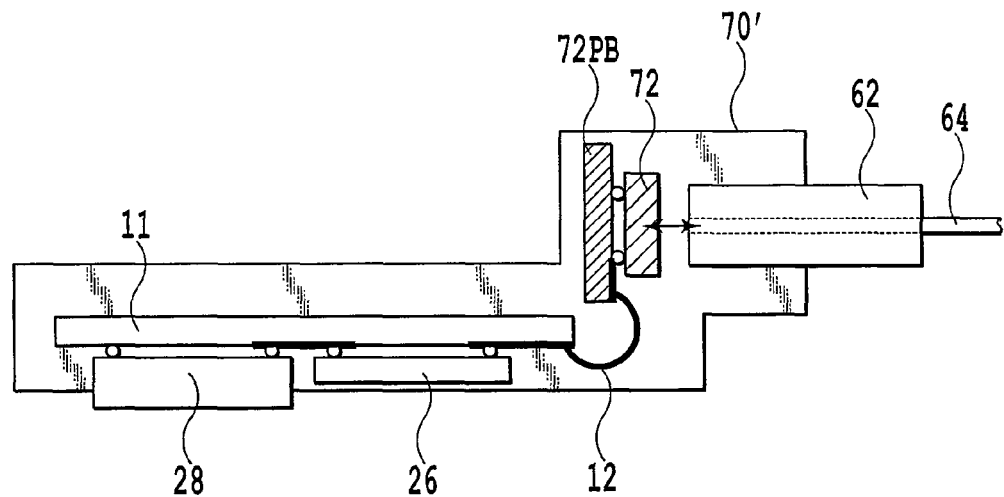
FIG. 13B is an illustration showing a configuration of an example for reference.

In comparison to a case wherein a connector 62 is disposed at an end of a casing 70' instead of being disposed above a substrate 11 as seen in the example for reference shown in FIG. 13B, the present embodiment makes it possible to provide an optical module with a smaller size because the connector 62 protrudes from an end of the casing 70' in a smaller amount.

Figure 14:
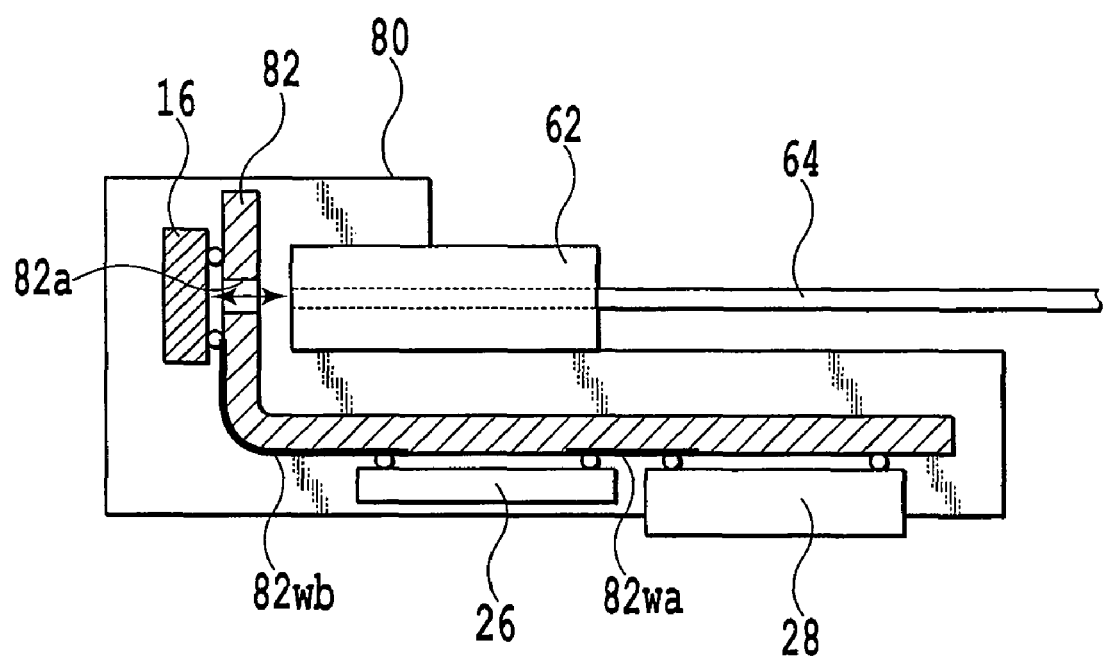
FIG. 14 is an illustration schematically showing a general configuration of a third embodiment of the optical module according to the present invention.

FIG. 14 schematically shows a general configuration of a third embodiment of the optical module according to the present invention.

The optical module shown in FIG. 14 includes a substrate 82 having flexible properties which provide bendability similar to the substrate 30 forming part of the semiconductor submodule described above and shown in FIG. 4.

The substrate 82 is formed to have a predetermined thickness and is formed from, for example, a polyimide system or acrylic resin or a liquid crystal polymer. On a surface region of the substrate 82 where an optical semiconductor device 16 is disposed, a high-speed electrical transmission path 82wb is formed, one end of the path being electrically connected to the optical semiconductor device 16, another end of the path being connected to a semiconductor device 26. For example, high-speed electrical signals are transmitted over the high-speed electrical transmission path 82wb at a communication speed (data transfer amount) not lower than 5 Gbps and not higher than 100 Gbps. A through hole 82a is formed in part of the substrate 82 facing the optical semiconductor device 16. The semiconductor device 26 and an electrical connector 28 which are located adjacent to each other are connected by a high-speed electrical transmission path 82wa.

The part of the substrate 82 where the optical semiconductor device 16 is provided is fixed by a casing 80 forming an outer wall of the optical module such that a surface thereof becomes perpendicular to a top surface of the semiconductor device 26. A connector 62 to be connected with an optical fiber 64 is disposed on the casing 80 in a position in a face-to-face relationship with the part of the substrate 82 where the optical semiconductor device 16 is provided. For example, the connector 62 is a connector having a connector housing and a support section as shown in FIGS. 5A to 7A.

As a result, the connector 62 is contained in a part of the casing 80 located above the semiconductor device 26 and the electrical connector 28 on the substrate 82, and the optical fiber 64 is disposed such that the axis thereof becomes substantially parallel to the surface of the substrate 82. Thus, the optical module can be provided with a small size. Since the transmission paths are formed on the single substrate 82, improved high-speed signal transmission characteristics can be achieved.

Figure 15:
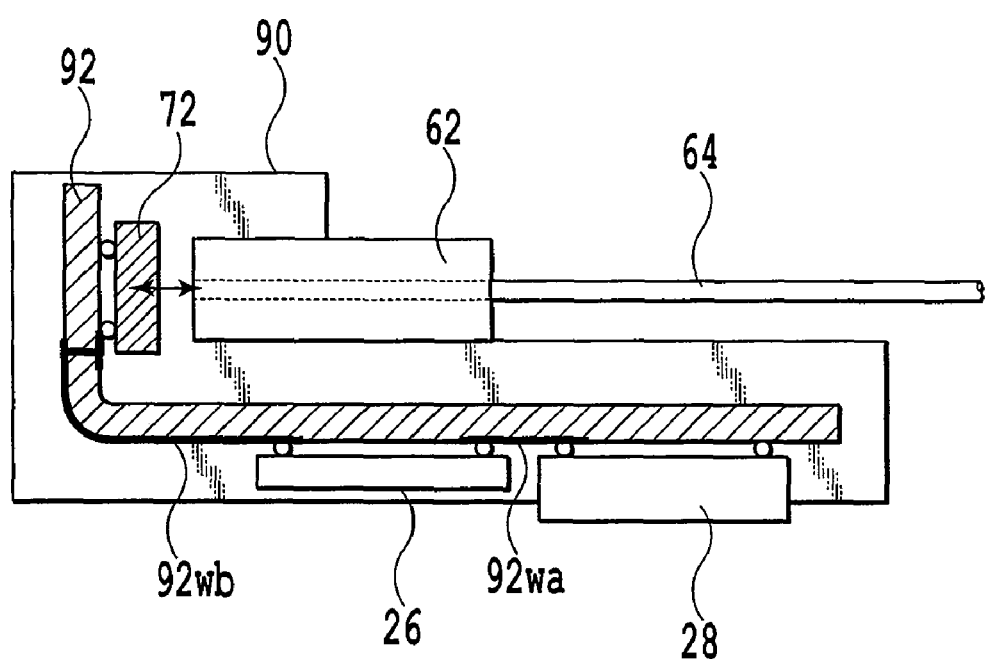
FIG. 15 is an illustration schematically showing a general configuration of a fourth embodiment of the optical module according to the present invention.

FIG. 15 schematically shows a general configuration of a fourth embodiment of the optical module according to the present invention.

In the example shown in FIG. 15, an optical semiconductor 72 is disposed on a substrate 92 instead of the substrate 82 and the optical semiconductor device 16 in FIG. 14. Since the optical semiconductor device 72 is an optical semiconductor device of the type emitting at a surface opposite to electrodes, in the present embodiment, a light beam is not required to travel through a substrate as described above.

The substrate 92 is formed to have a predetermined thickness and is formed from, for example, a polyimide system or acrylic resin or a liquid crystal polymer. On a surface region of the substrate 92 where an optical semiconductor device 72 is disposed, a high-speed electrical transmission path 92wb is formed, one end of the path being electrically connected to the optical semiconductor device 72, another end of the path being connected to a semiconductor device 26. For example, high-speed electrical signals are transmitted over the high-speed electrical transmission path 92wb at a communication speed (data transfer amount) not lower than 5 Gbps and not higher than 100 Gbps. The semiconductor device 26 and an electrical connector 28 which are located adjacent to each other are connected by a high-speed electrical transmission path 92wa.

The part of the substrate 92 where the optical semiconductor device 72 is provided is fixed by a casing 90 forming an outer wall of the optical module such that a surface thereof becomes perpendicular to a top surface of the semiconductor device 26. A connector 62 to be connected with an optical fiber 64 is disposed on the casing 90 in a position in a face-to-face relationship with the part of the substrate 92 where the optical semiconductor device 72 is provided. For example, the connector 62 is a connector having a connector housing and a support section as shown in FIGS. 5A to 7A.

As a result, the connector 62 is contained in a part of the casing 90 located above the semiconductor device 26 and the electrical connector 28 on the substrate 92, and the optical fiber 64 is disposed such that the axis thereof becomes substantially parallel to the surface of the substrate 92. Thus, the optical module can be provided with a small size. Since the transmission paths are formed on the single substrate 92, improved high-speed signal transmission characteristics can be achieved.

Figure 16A:
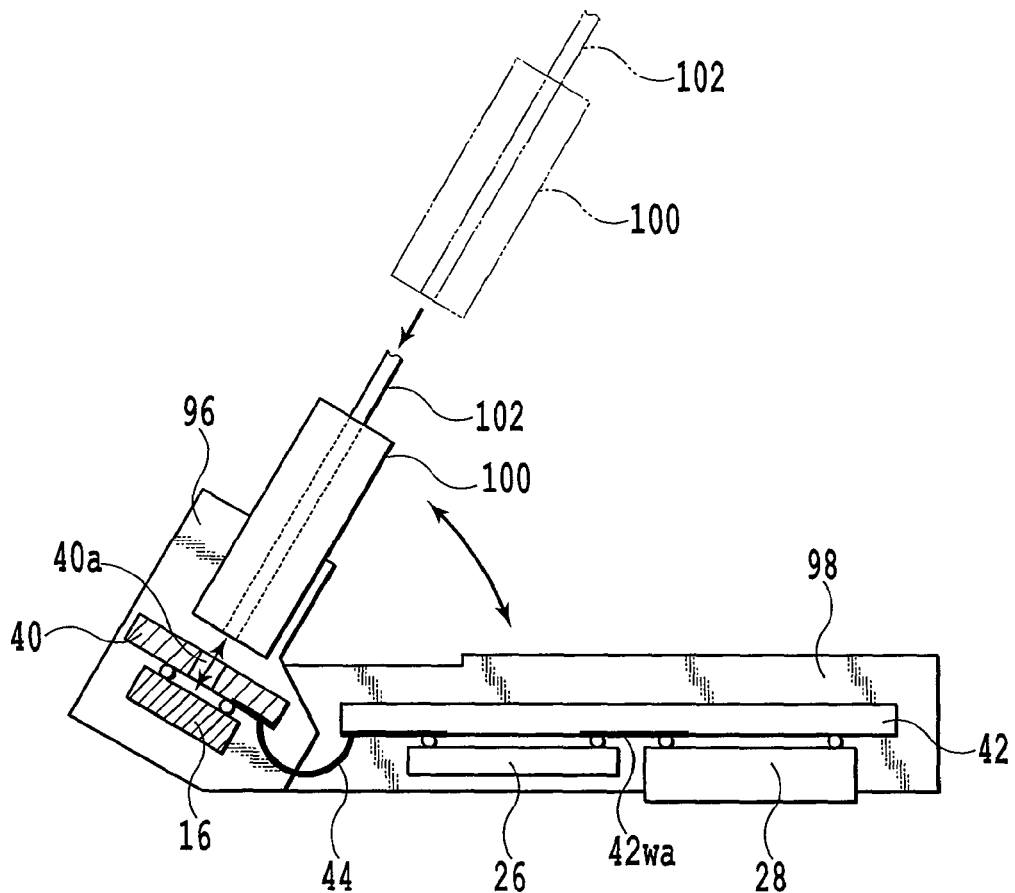
FIG. 16A is an illustration schematically showing a general configuration of a fifth embodiment of the optical module according to the present invention.
Figure 16B:
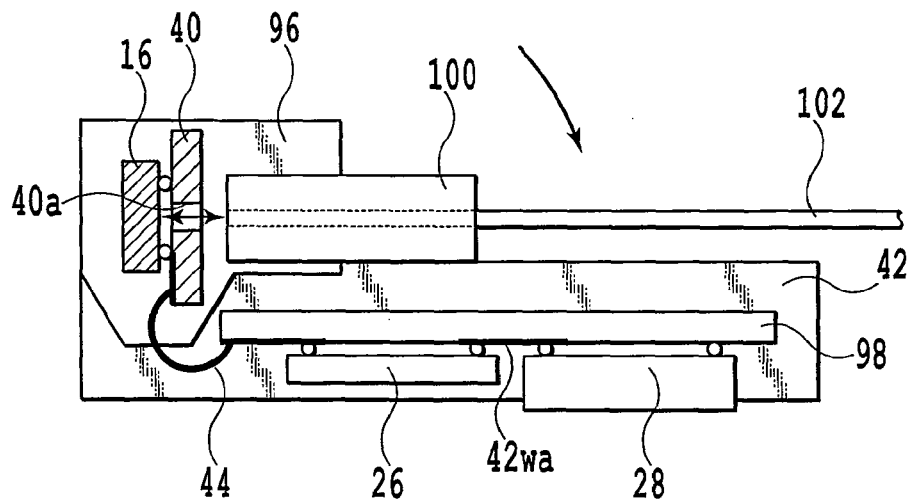
FIG. 16B is an illustration schematically showing the general configuration of the fifth embodiment of the optical module according to the present invention.

FIGS. 16A and 16B schematically show a general configuration of a fifth embodiment of the optical module according to the present invention.

The optical module shown in FIG. 16A incorporates a semiconductor submodule as described above and shown in FIG. 3. The configuration of the semiconductor submodule shown in FIG. 3 will not be described to avoid duplication.

The optical module includes a casing 96 in which a substrate 40 is disposed and a casing 98 in which a substrate 42 is disposed, as major elements.

One end of the casing 96 is rotatably supported at one end of the casing 98 by, for example, a support shaft for coupling. The substrate 42 is disposed such that a surface thereof is substantially parallel to a top surface of the casing 98.

In a part of the casing 96 facing the substrate 40, a connector housing section is formed to allow mounting and removal of a connector 100 to which one end of an optical fiber 102 is connected. The connector 100 may be an MT connector or an FPC (Fiber PC) connector which will be described later.

In such a configuration, when the connector 100 is mounted from above the connector housing section of the casing 96 or removed therefrom as indicated by a solid line and a chain double-dashed line in FIG. 16A, the mounting or removing operation is performed, for example, with the casing 96 rotated and tilted relative to the casing 98. Thus, the mounting or removing operation is facilitated. When the optical fiber 102 is laid, as shown in FIG. 16B, the casing 96 is rotated in the direction indicated by the arrow such that the casing 96 and the connector 100 are put close to the casing 98. As a result, the connector 100 is disposed such that it will not protrude from an end of the casing 98. In addition, the optical fiber 102 is disposed such that the axis thereof will be substantially in parallel with a surface of the substrate 42.

Figure 17A:
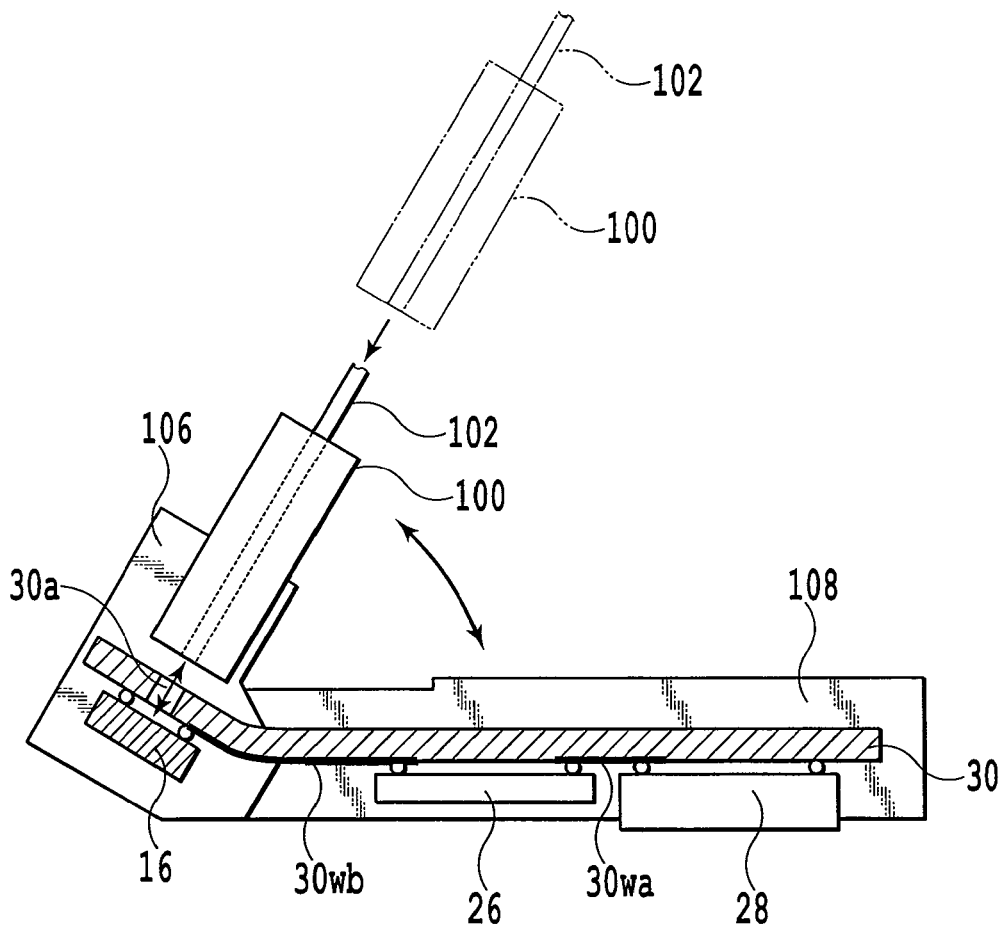
FIG. 17A is an illustration schematically showing a general configuration of a sixth embodiment of the optical module according to the present invention.
Figure 17B:
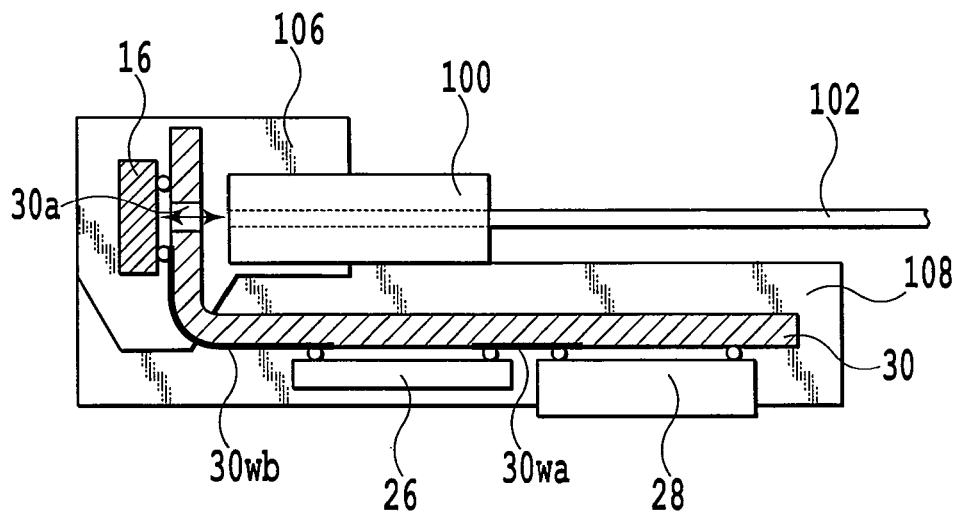
FIG. 17B is an illustration schematically showing the general configuration of the sixth embodiment of the optical module according to the present invention.

FIGS. 17A and 17B schematically show a general configuration of a sixth embodiment of the optical module according to the present invention.

The optical module shown in FIG. 17A incorporates a semiconductor submodule as described above and shown in FIG. 4. The configuration of the semiconductor submodule shown in FIG. 4 will not be described to avoid duplication.

The optical module includes a casing 108 in which a semiconductor device 26 and an electrical connector 28 on a substrate 30 are disposed and a casing 106 in which an optical semiconductor device 16 on a substrate 30 is disposed, as major elements.

One end of the casing 106 is rotatably supported at one end of the casing 108 by, for example, a support shaft for coupling. The part of the substrate 30 having the optical semiconductor device 16 provided thereon is disposed such that a surface thereof is substantially parallel to a top surface of the casing 108.

In a part of the casing 106 facing the substrate 30, a connector housing section is formed to allow mounting and removal of a connector 100 to which one end of an optical fiber 102 is connected. The connector 100 may be an MT connector or an FPC (Fiber PC) connector which will be described later.

In such a configuration, when the connector 100 is mounted from above the connector housing section of the casing 106 or removed therefrom as indicated by a solid line or a chain double-dashed line in FIG. 17A, the mounting or removing operation is performed, for example, with the casing 106 rotated and tilted relative to the casing 108. Thus, the mounting or removing operation is facilitated. When the optical fiber 102 is laid, as shown in FIG. 17B, the casing 106 is rotated in the direction indicated by the arrow such that the casing 106 and the connector 100 are put close to the casing 108. As a result, the connector 100 is disposed such that it will not protrude from an end of the casing 108. In addition, the optical fiber 102 is disposed such that the axis thereof will be substantially in parallel with the surface of the part of the substrate 30 where the semiconductor device 26 is provided.

Figure 22A:
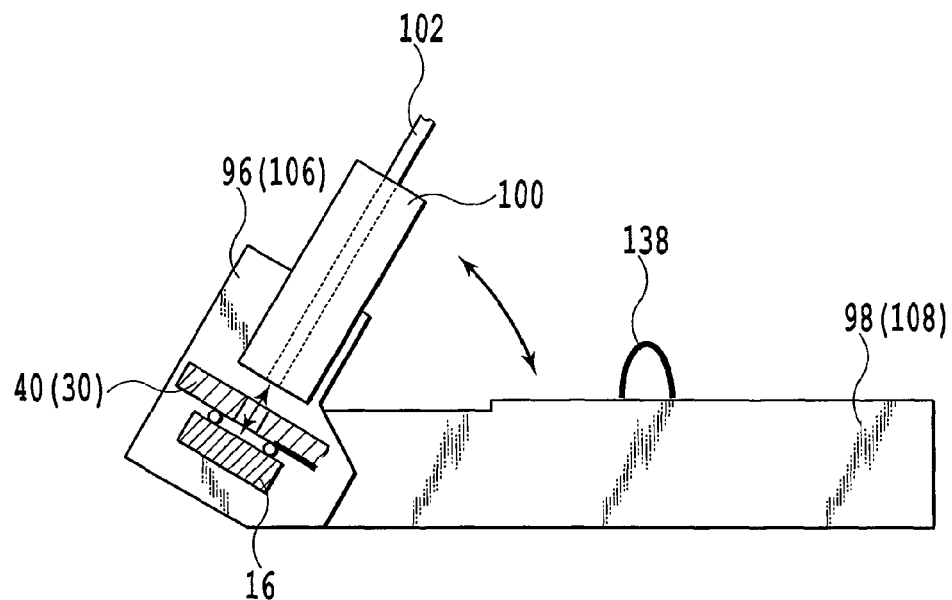
FIG. 22A is an illustration schematically showing a configuration of the fifth or sixth embodiment of the optical module according to the present invention, in which a lock mechanism is provided.
Figure 22B:
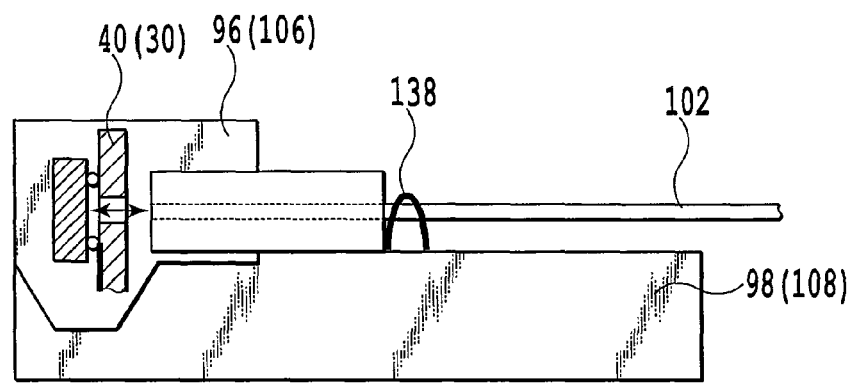
FIG. 22B is an illustration schematically showing the configuration of the fifth or sixth embodiment of the optical module according to the present invention, in which a lock mechanism is provided.
Figure 23:
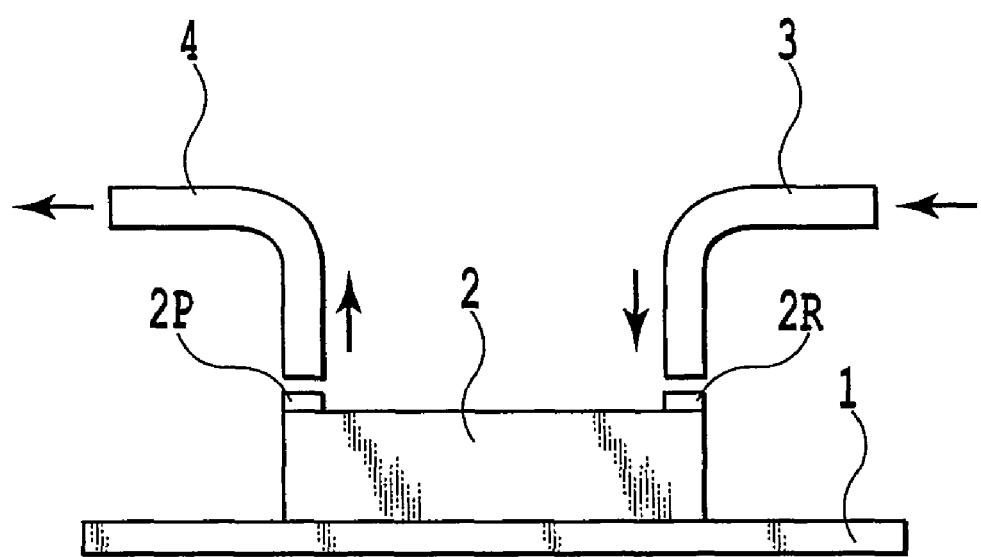
FIG. 23 is an illustration showing disposition of optical fibers in a conventional apparatus.
Figure 24:
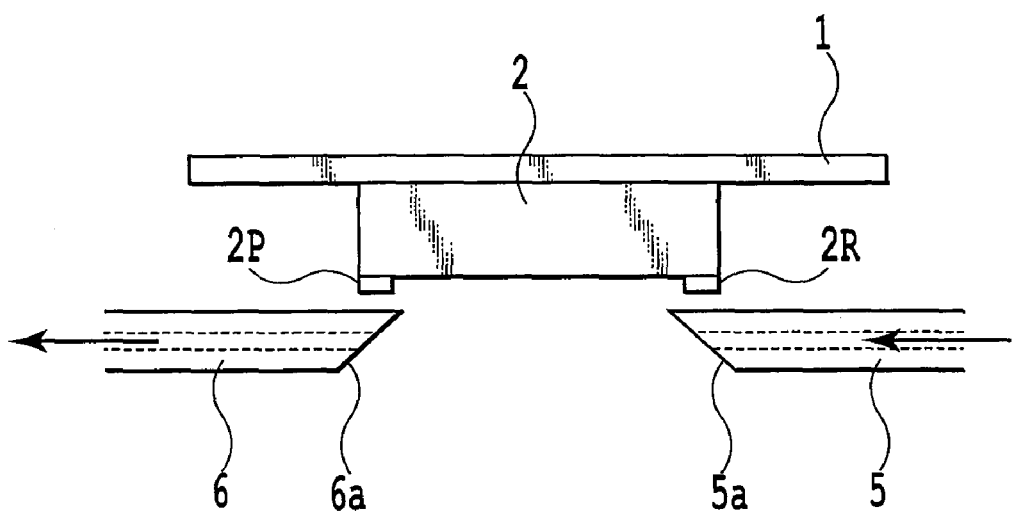
FIG. 24 is an illustration showing disposition of optical fibers in a conventional apparatus.

In the fifth and sixth embodiments, as shown in FIGS. 22A and 22B respectively, a mating/locking mechanism may be provided on the top of the casing 98 or 108 for securing the casing 96 or 106 on the respective casing 98 or 108. For example, the mating/locking mechanism may be a spring member 138 for securing by pressing an end of the connector 100 toward the above-described support shaft.

Further, in the fifth or sixth embodiment, an optical semiconductor device 72 as described above may obviously be provided instead of the optical semiconductor device 16.

Figure 18:
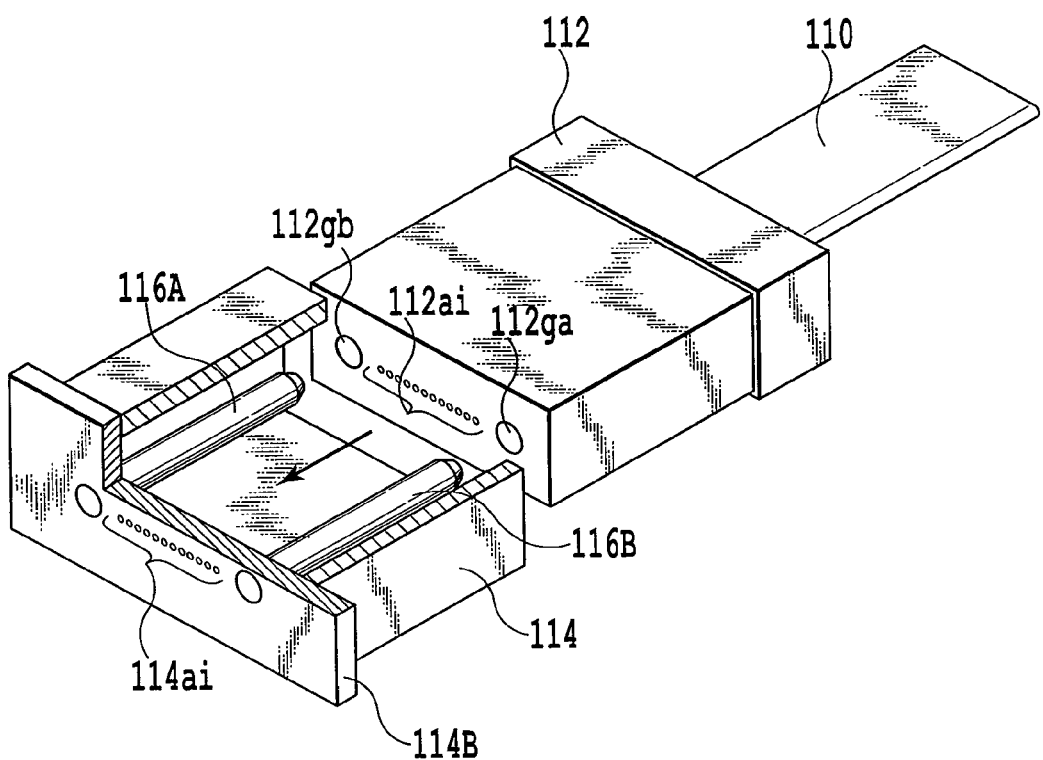
FIG. 18 is a perspective view of a configuration of an MT connector used in each of the first to sixth embodiments of the optical module according to the present invention.

FIG. 18 schematically shows a configuration of an MT connector used in each of the above-described first to sixth embodiments of the optical module according to the present invention, the configuration being shown along with a housing forming a part of the optical module.

Referring to FIG. 18, the MT connector includes a ferrule 112 connected to one end of an optical fiber ribbon 110. On a connecting end face on one side of the ferrule 112 which is rectangular parallelepiped, holes 112$ai$ (i=1 to n and n=12) are formed to expose a strand of each optical fiber of the optical fiber ribbon 110. The holes 112$ai$ are formed in a row at predetermined intervals along the width direction of the optical fiber ribbon 110. The connecting end face is polished. On both sides of the array of the holes 112$ai$, holes 112$ga$ and 112$gb$ are formed to be engaged with respective guide pins 116A and 116B provided in a housing 114 when the MT connector is inserted in the direction of the arrow in FIG. 18.

In the housing 114 to and from which the MT connector is mounted and removed, the pair of guide pins 116A and 116B is provided in a ferrule housing section for housing the ferrule 112. The guide pins 116A and 116B are disposed in a face-to-face relationship at a predetermined interval from each other such that their axes are perpendicular to a surface of a vertical substrate 114B provided at an end of the housing 114.

In a part of the vertical substrate 114B made of silicon or glass located between the guide pins 116A and 116B, through holes 114$ai$ (i=1 to n and n=12) allowing optical beams from the optical semiconductor device which is not shown to pass are formed in a row in association with the above-described holes 112$ai$.

When the MT connector is mounted in the ferrule housing section, the end face of the ferrule 112 is placed with attaching onto the surface of the vertical substrate 114B to be held thereon by the resilient force of a spring. A glass plate or a glass plate having a lens may be provided on the surface of the vertical substrate 114B as in the above-described example.

Figure 19:
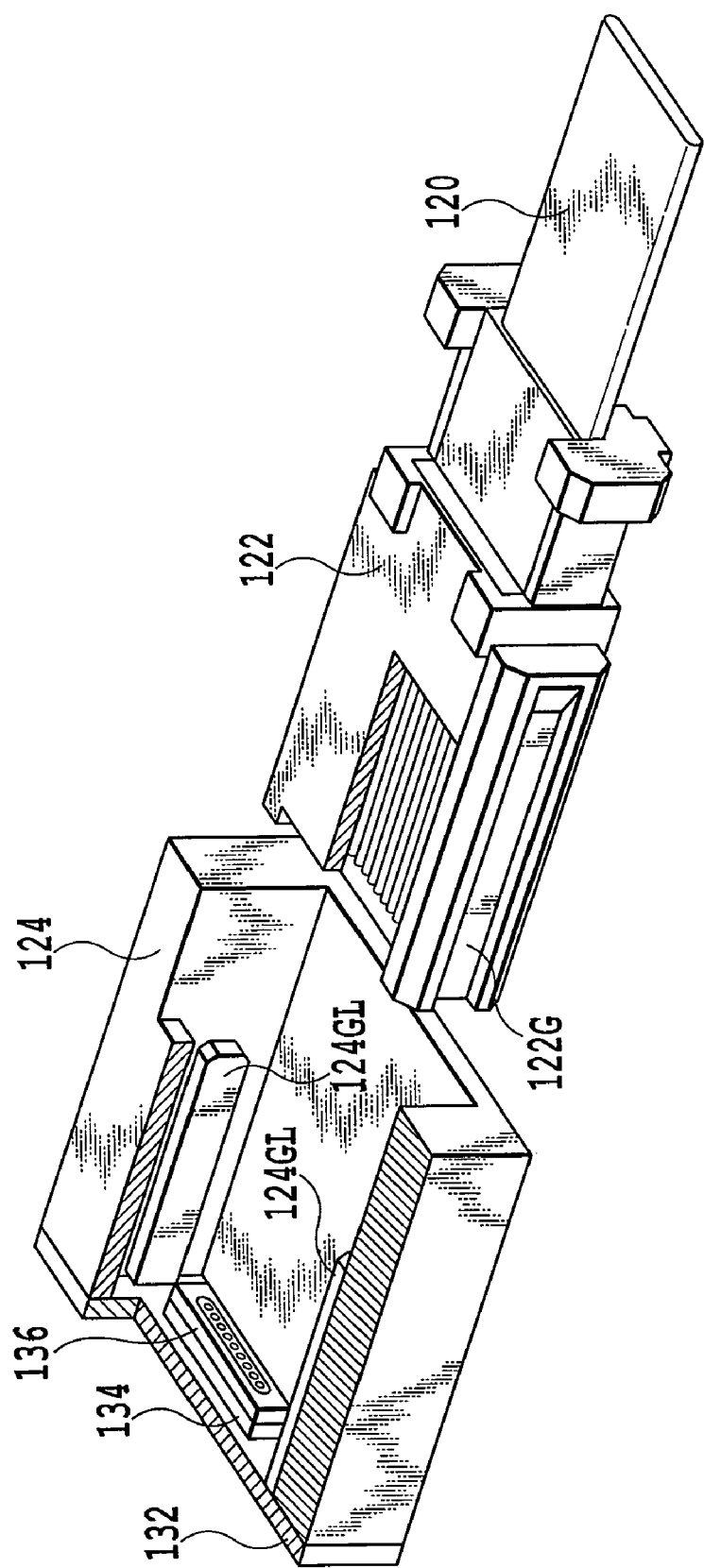
FIG. 19 is a perspective view of a configuration of a fiber PC connector used in each of the first to sixth embodiments of the optical module according to the present invention.

FIG. 19 schematically shows a configuration of a fiber PC connector used in each of the above-described first to sixth embodiments of the optical module according to the present invention along with a housing forming a part of the optical module.

Referring to FIG. 19, the fiber PC connector includes a connector plug 122 connected to one end of an optical fiber ribbon 120 through a securing section. On a connecting end face of the connector plug 122, a plurality of holes is formed to expose a strand of each optical fiber of the optical fiber ribbon 120. The holes are formed in a row at predetermined intervals along the width direction of the optical fiber ribbon 120. The tips of the optical fibers are held in a cantilevered manner with the jackets of the fibers removed, and the tips are tapered to allow smooth insertion of the same into micro holes which will be described later. Grooves 122G are formed on both side surfaces of the connector plug 122.

A fiber PC connector positions a bare optical fiber in a micro hole as will be described later without using a ferrule as done in an MT connector (see 1996 IEICE Electro Society Convention C-3-133) and deflects the optical fiber to put the tip of the optical fiber in tight contact using a buckling force which is a resilient restoring force.

Figure 20:
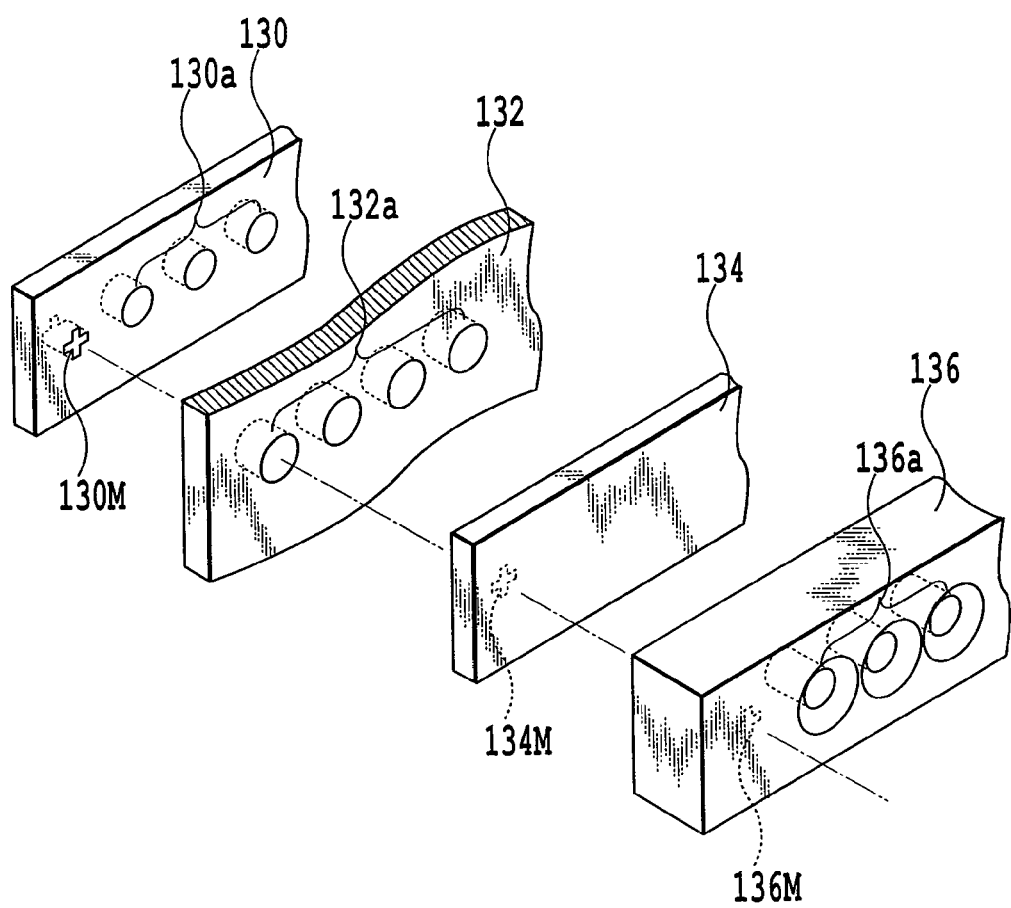
FIG. 20 is a perspective view showing constituent elements constituting a plug connecting section of a housing in the example shown in FIG. 19.

A housing 124 to and from which the connector plug 122 is mounted and removed includes a plug housing section for housing the connector plug 122. In the plug housing section, guide rails 124GL engaged with the grooves 122G of the connector plug 122 to guide the connector plug 122 are formed on both side walls of the housing section in a face-to-face relationship with each other. A vertical substrate 132 is provided at an end of the housing 124. As shown in enlarged scale in FIG. 20, the vertical substrate 132 has through holes 132$a$ allowing light beams to pass arranged in a row at predetermined intervals in association with light emitting sections (light-receiving sections) 130*a* of respective optical semiconductor devices 130 disposed on a back side thereof.

Figure 21A:
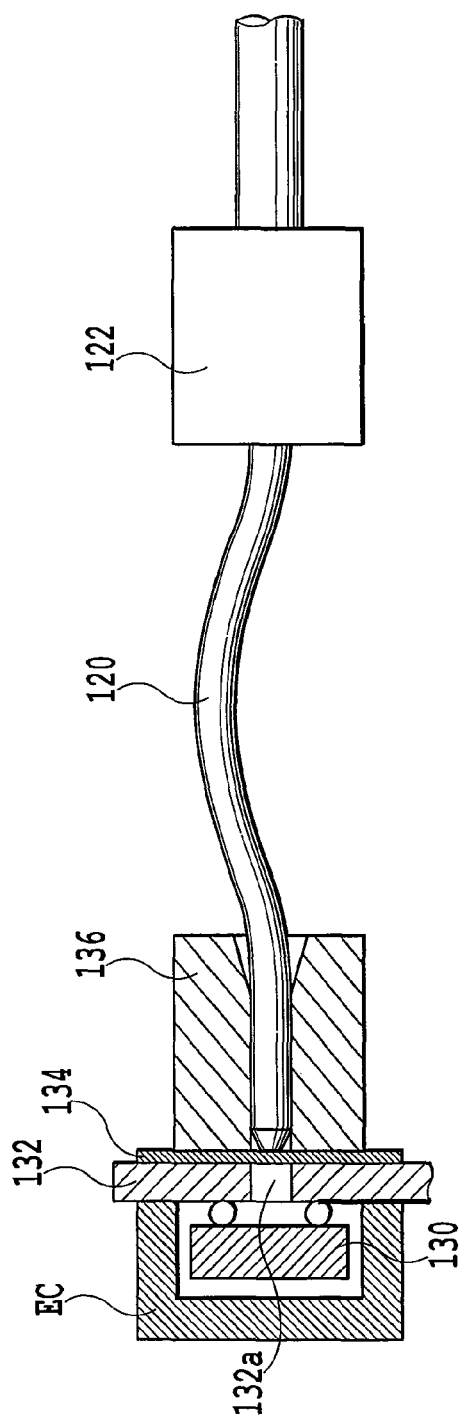
FIG. 21A is a sectional view of the embodiment shown in FIG. 19 made available for explaining an operation thereof.
Figure 21B:
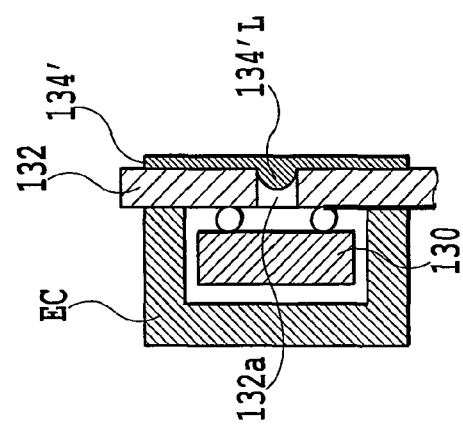
FIG. 21B is a sectional view of the embodiment shown in FIG. 19 made available for explaining an operation thereof.

A glass plate 134 is disposed on a surface of the vertical substrate 132. Alternatively, a glass plate 134' having a micro lens 134'L may be provided as shown in FIG. 21B. In this case, the efficiency of optical coupling between an optical semiconductor device and an optical fiber can be further improved. As shown in an enlarged scale in FIG. 20, a micro hole array 136 having micro holes 136*a* associated with the light-emitting sections (light-receiving sections) 130*a* of the optical semiconductor devices 130 and the strands of the optical fibers is provided on the glass plate 134.

When assembling the vertical substrate 132, the micro hole array 136, and etc. on the end of the housing 124, the optical semiconductor devices 130 are first mounted on the vertical substrate 132 with solder balls interposed while aligning the wirings on the substrate and wirings of the optical semiconductor devices. Next, the optical semiconductor devices 130, the glass plate 134, and the micro hole array 136 are mounted with their respective alignment markers 136M, 134M, and 130M matched with each other using the through holes 132*a* of the vertical substrate 132. Thus, the light-receiving sections of the optical semiconductor device 130 and the micro holes 136*a* are aligned with high accuracy.

When the connector plug 122 is mounted in the plug housing section of the housing 124, the connector plug 122 is guided by the guide rails 124GL, whereby the tip of the strand of each optical fiber of the optical fiber ribbon 120 is inserted into a micro hole to touch on a surface of the glass plate 134. As a result, as shown in FIG. 21A, the optical fibers are sagging between the micro hole array 136 and the part of the connector plug 122 holding the optical fiber ribbon 120. Thus, any positional difference between the tips of the plurality of optical fibers is absorbed, and a resultant buckling force puts the tips of the optical fibers in tight contact with the glass plate 134 to achieve a state of connection with small reflections. The optical semiconductor devices have high light receiving and emitting characteristics because they are less vulnerable to reflections, and optical coupling can be achieved with a small amount of loss because losses attributable to reflections are small.

An MT connector as described above results in greater reflections because it is difficult to achieve such tight contact. In the case of the MT connector, optical coupling between an optical semiconductor device and an optical fiber is determined by the accuracy of the mounting positions of the guide pins. Since it is therefore necessary to mount the guide pins on the substrate with high accuracy, the substrate must be rigid and is therefore limited to the use of silicon or a glass plate.

In the case of the fiber PC connector, the optical semiconductor devices and the micro holes are accurately fixed through the vertical substrate, and the guide rails are required only to keep positional accuracy until the optical fibers are inserted into the micro holes. Therefore, sufficient positional accuracy can be achieved even if the substrate is made of resin or liquid crystal. In other words, the optical semiconductor devices and the micro holes both are mounted with high precision on the vertical substrate with using previous described alignment marks 130M and 136M. The strands of the optical fibers can be inserted easily into the micro holes with a tiny pushing force. Thus, different from the case of the MT connectors, the vertical substrate can be made of flexible films such as a resin or a liquid crystal polymer.

When the optical semiconductor devices 130 are enclosed with a sealing member EC as shown in FIGS. 21A and 21B, since the substrate can be enclosed from both sides thereof, the member allows the substrate to be more easily enclosed compared to a structure which disallows communication light to travel through the substrate. In other words, when the optical semiconductor devices 130 are enclosed with a sealing member EC with gas barrier features as shown in FIGS. 21A and 21B, since the substrate with micro holes can be enclosed from both sides with gas barrier parts of the sealing member EC and a glass plate 134, the optical semiconductor devices on the substrate are easily hermetically sealed.

The invention claimed is:

1. A semiconductor submodule comprising:
   a first substrate having at least one hole, at least one optical semiconductor device disposed such that light passes through said hole, and at least one high-speed electrical signal transmission path electrically connected with said optical semiconductor device;
   a second substrate having a semiconductor device for driving said optical semiconductor device, at least one high-speed electrical signal transmission path electrically connected with said semiconductor device, and an electrical connector having the function of inputting or outputting a high-speed electrical signal with respect to the outside, with the connector being connected with said high-speed electrical signal transmission path;
   wherein a terminal end of each of said high-speed electrical signal transmission paths is connected such that an end face 1 of said first substrate and an end face 2 of said second substrate are connected and such that said optical semiconductor device and said semiconductor device are disposed on a surface side common to them with said end faces connected to each other in the form of an opposed connection;
   said first substrate has a mechanism for allowing it to be folded toward the opposite side to the surface thereof on which said optical semiconductor device is mounted, either of said end faces opposite to each other serving as a fulcrum of said mechanism; and
   a cap structure for hermetically enclosing said optical semiconductor device is provided on said first substrate on which said optical semiconductor device is mounted and at least one micro lens or a transparent thin plate having an optical axis extending along the center axis of said hole and having a surface area smaller than the surface area of said first substrate is provided on a back surface side of said first substrate on which said optical semiconductor device is mounted.

2. A semiconductor submodule comprising:
   a first substrate having at least one hole, at least one optical semiconductor device disposed such that light passes through said hole, and at least one high-speed electrical signal transmission path electrically connected with said optical semiconductor device;
   a second substrate having a semiconductor device for driving said optical semiconductor device, at least one high-speed electrical signal transmission path electrically connected with said semiconductor device, and an electrical connector having the function of inputting or outputting a high-speed electrical signal with respect to the outside, with the connector being connected with said high-speed electrical signal transmission path;
   wherein a terminal end of each of said high-speed electrical signal transmission paths is connected such that an end face 1 of said first substrate and an end face 2 of said second substrate are connected and such that said optical semiconductor device and said semiconductor device are disposed on a surface side common to them with said end faces connected to each other in the form of an opposed connection;

said first substrate has a mechanism for allowing it to be folded toward the opposite side to the surface thereof on which said optical semiconductor device is mounted, either of said end faces opposite to each other serving as a fulcrum of said mechanism;

a micro hole provided opposite to the hole of said first substrate has a funnel-like inner diametrical shape on a side thereof where an optical fiber is inserted, the length of a strand of the optical fiber being set greater than the length of said micro hole, the strand of the optical fiber being passed through the micro hole while applying a desired pressing force to the strand with the jacket of the optical fiber removed to bring the tip of the strand of said optical fiber into intimate contact with a surface of said micro lens or a surface of the transparent thin plate; and said first substrate is folded by said foldable mechanism at 90 degrees to said second substrate to prevent said optical fiber from protruding and to align said optical fiber above said second substrate in a direction parallel to a surface of said second substrate.

3. A semiconductor submodule comprising:

a first substrate having at least one hole, at least one optical semiconductor device disposed such that light passes through said hole, and at least one high-speed electrical signal transmission path electrically connected with said optical semiconductor device;

a second substrate having a semiconductor device for driving said optical semiconductor device, at least one high-speed electrical signal transmission path electrically connected with said semiconductor device, and an electrical connector having the function of inputting or outputting a high-speed electrical signal with respect to the outside, with the connector being connected with said high-speed electrical signal transmission path;

wherein a terminal end of each of said high-speed electrical signal transmission paths is connected such that an end face 1 of said first substrate and an end face 2 of said second substrate are connected and such that said optical semiconductor device and said semiconductor device are disposed on a surface side common to them with said end faces connected to each other in the form of an opposed connection;

said first substrate has a mechanism for allowing it to be folded toward the opposite side to the surface thereof on which said optical semiconductor device is mounted, either of said end faces opposite to each other serving as a fulcrum of said mechanism; and the terminal ends of said high-speed electrical signal transmission paths provided on the end face 1 of said first substrate and the end face 2 of said second substrate, respectively, are electrically connected to each other by a metal wire having resilient properties and having a desired thickness and comprising a mechanism to enable folding by using the center of said metal wire as a fulcrum.

4. A semiconductor submodule according to claim 3, wherein said first substrate is a silicon substrate or a glass substrate or a resin-based substrate and said second substrate is a resin-based substrate.

5. A semiconductor submodule according to claim 3, wherein the inner diameter of said at least one or more holes provided on said first substrate has a desirable value with respect to the outer diameter of a strand of the optical fiber, and said hole is processed to have a funnel-like hole shape to facilitate insertion of the optical fiber into the hole, and a terminal end face of the strand of said optical fiber is made to always touch on a surface of a micro lens or a transparent thin plate provided on said substrate at a constant pressing force provided by a buckled state of the strand of said optical fiber resulting from the length in which the strand of said optical fiber protrudes from the tip of the connector when the strand of said optical fiber is inserted in said hole.

6. A semiconductor submodule according to claim 3, wherein a connector connected to a connecting section of said first substrate has a connector housing having a U-shaped sectional shape and an internal spot facing in an amount greater than the size of said micro hole and comprises at least one or more optical fibers horizontally aligned in a row with the length of protrusion of a strand of the optical fiber from an end face of the opening section of the connector housing adjusted to a desired length;

a receptacle capable of accommodating said connector housing is further provided on a micro lens or a transparent thin plate on said first substrate; and a terminal end face of the strand of said optical fiber being made to always touch on a surface of said micro lens or a surface of the thin plate glass at a constant pressing force provided by a buckled state of the strand of said optical fiber resulting from the length in which the strand of said optical fiber protrudes from the tip of the connector when the end face of the opening section of said connector housing is brought into intimate contact with the surface of said micro lens, the surface of said transparent thin plate, or said receptacle.

7. A semiconductor submodule comprising:

a first substrate having at least one hole, at least one optical semiconductor device disposed such that light passes through said hole, a semiconductor device for driving said optical semiconductor device, and at least one high-speed electrical signal transmission path electrically connected between said optical semiconductor device and said semiconductor device;

a second substrate having an electrical connector having the function of inputting or outputting a high-speed electrical signal with respect to the outside and at least one high-speed electrical signal transmission path electrically connected with said electrical connector at one end thereof;

wherein a terminal end of each of said high-speed electrical signal transmission paths is connected such that said optical semiconductor device and said semiconductor device and said electrical connector are disposed on a surface side common to them with end faces of said first substrate and said second substrate opposite to each other in the form of an opposed connection;

said first substrate has a mechanism for allowing it to be folded toward the opposite side to the surface thereof on which said optical semiconductor device is mounted, either of said end faces opposite to each other serving as a fulcrum of said mechanism; and a cap structure for hermetically enclosing said optical semiconductor device is provided on said first substrate on which said optical semiconductor device is mounted and at least one micro lens or a transparent thin plate having an optical axis extending along the center axis of said hole and having a surface area smaller than the surface area of said first substrate is provided on a back surface side of said first substrate on which said optical semiconductor device is mounted.

8. A semiconductor submodule comprising:
a first substrate having at least one hole, at least one optical semiconductor device disposed such that light passes through said hole, a semiconductor device for driving said optical semiconductor device, and at least one high-speed electrical signal transmission path electrically connected between said optical semiconductor device and said semiconductor device;
a second substrate having an electrical connector having the function of inputting or outputting a high-speed electrical signal with respect to the outside and at least one high-speed electrical signal transmission path electrically connected with said electrical connector at one end thereof;
wherein a terminal end of each of said high-speed electrical signal transmission paths is connected such that said optical semiconductor device and said semiconductor device and said electrical connector are disposed on a surface side common to them with end faces of said first substrate and said second substrate opposite to each other in the form of an opposed connection;
said first substrate has a mechanism for allowing it to be folded toward the opposite side to the surface thereof on which said optical semiconductor device is mounted, either of said end faces opposite to each other serving as a fulcrum of said mechanism;
a micro hole provided opposite to the hole of said first substrate has a funnel-like inner diametrical shape on a side thereof where an optical fiber is inserted, the length of a strand of the optical fiber being set greater than the length of said micro hole, the strand of the optical fiber being passed through the micro hole while applying a desired pressing force to the strand with the jacket of the optical fiber removed to bring the tip of the strand of said optical fiber into intimate contact with a surface of said micro lens or a surface of the transparent thin plate; and
said first substrate is folded by said foldable mechanism at 90 degrees to said second substrate to prevent said optical fiber from protruding and to align said optical fiber above said second substrate in a direction parallel to a surface of said second substrate.

9. A semiconductor submodule comprising:
a first substrate having at least one hole, at least one optical semiconductor device disposed such that light passes through said hole, a semiconductor device for driving said optical semiconductor device, and at least one high-speed electrical signal transmission path electrically connected between said optical semiconductor device and said semiconductor device;
a second substrate having an electrical connector having the function of inputting or outputting a high-speed electrical signal with respect to the outside and at least one high-speed electrical signal transmission path electrically connected with said electrical connector at one end thereof;
wherein a terminal end of each of said high-speed electrical signal transmission paths is connected such that said optical semiconductor device and said semiconductor device and said electrical connector are disposed on a surface side common to them with end faces of said first substrate and said second substrate opposite to each other in the form of an opposed connection;
said first substrate has a mechanism for allowing it to be folded toward the opposite side to the surface thereof on which said optical semiconductor device is mounted, either of said end faces opposite to each other serving as a fulcrum of said mechanism; and
the terminal ends of said high-speed electrical signal transmission paths provided on the end faces of said first substrate and said second substrate, respectively, are electrically connected to each other by a metal wire having resilient properties and having a desired thickness and comprises a mechanism to enable folding using the center of said metal wire as a fulcrum.

10. A semiconductor submodule comprising:
a bendable substrate having at least one hole, at least one optical semiconductor device disposed such that light passes through said hole;
a semiconductor device for driving said optical semiconductor device;
an electrical connector having the function of inputting or outputting a high-speed electrical signal with respect to the outside;
a first high-speed electrical signal transmission path electrically connecting said optical semiconductor device and said semiconductor device to each other; and
a second high-speed electrical signal transmission path electrically connecting said semiconductor device and said electrical connector to each other, the paths being provided on a common mounting surface,
wherein the part of said substrate where said optical semiconductor device and said semiconductor device are mounted can be folded along with said second high-speed electrical signal transmission path toward the opposite side to the surface on which said optical semiconductor device is mounted, a part of said mounting surface located between said semiconductor device and said electrical connector serving as a bending section, and
a cap structure for hermetically enclosing said optical semiconductor device is provided on said substrate on which said optical semiconductor device is mounted and at least one micro lens or a transparent thin plate having an optical axis extending along the center axis of said hole and having a surface area smaller than the surface area of said substrate is provided on a back surface side of said substrate on which said optical semiconductor device is mounted.

* * * * *